United States Patent
Abe et al.

(10) Patent No.: US 7,892,626 B2
(45) Date of Patent: Feb. 22, 2011

(54) SUBSTRATE WITH PLANE PATTERNS AND DISPLAY DEVICE USING THE SAME

(75) Inventors: Makoto Abe, Sendai (JP); Hiroki Kaneko, Hitachi (JP); Takuya Takahashi, Hitachi (JP); Etsuko Nishimura, Hitachiota (JP); Yoshitaka Tsutsui, Sendai (JP); Takaaki Suzuki, Nishiibaragi (JP)

(73) Assignee: Future Vision Inc., Tokyo (JP)

( * ) Notice: Subject to any disclaimer, the term of this patent is extended or adjusted under 35 U.S.C. 154(b) by 296 days.

(21) Appl. No.: 11/220,742

(22) Filed: Sep. 8, 2005

(65) Prior Publication Data

US 2006/0057338 A1 Mar. 16, 2006

(30) Foreign Application Priority Data

Sep. 13, 2004 (JP) .............................. 2004-264917

(51) Int. Cl.
*B41M 5/00* (2006.01)
(52) U.S. Cl. .................... 428/195.1; 428/901; 174/250; 174/260; 349/145; 361/748; 361/777; 361/805
(58) Field of Classification Search .............. 428/195.1; 257/202, 204, 206, 618, 620, 622, 623; 349/139, 349/141, 143, 145, 146, 148; 345/55, 58; 427/97.3; 174/250, 254, 261, 268, 260; 361/748, 361/777, 778, 805
See application file for complete search history.

(56) References Cited

U.S. PATENT DOCUMENTS

| | | | | |
|---|---|---|---|---|
| 3,331,991 A | * | 7/1967 | Carlisle et al. ............... | 361/805 |
| 3,659,083 A | * | 4/1972 | Winter et al. ................ | 377/87 |
| 4,099,098 A | * | 7/1978 | Cola ........................... | 345/66 |
| 4,837,050 A | * | 6/1989 | Iwasa et al. ................. | 427/97.3 |
| 4,958,050 A | * | 9/1990 | Oku et al. .................... | 174/261 |
| 5,132,248 A | * | 7/1992 | Drummond et al. ......... | 505/325 |
| 5,253,010 A | * | 10/1993 | Oku et al. .................... | 396/542 |
| 5,506,607 A | * | 4/1996 | Sanders et al. ............... | 347/1 |
| 5,786,835 A | * | 7/1998 | Ikeda et al. .................. | 347/106 |
| 6,057,512 A | * | 5/2000 | Noda et al. .................. | 174/250 |
| 6,160,594 A | * | 12/2000 | Hanami et al. ............... | 349/34 |

(Continued)

FOREIGN PATENT DOCUMENTS

JP 2000-35394 12/2000

(Continued)

OTHER PUBLICATIONS

Castellano, Joseph A.; Handbook of Display Technologies; Academic Press, Inc. 1992, p. 186-196.*

(Continued)

*Primary Examiner*—Mark Ruthkosky
*Assistant Examiner*—Gerard T Higgins
(74) *Attorney, Agent, or Firm*—Antonelli, Terry, Stout & Kraus, LLP.

(57) ABSTRACT

A substrate with plane patterns formed in a liquid process wherein the plane patterns are formed based on a combination of plane shapes by which a difference in internal pressure of a solution between any two points of the solution is small, the solution being ejected onto the substrate so as to form the plane patterns by the liquid process.

13 Claims, 42 Drawing Sheets

U.S. PATENT DOCUMENTS

| | | | |
|---|---|---|---|
| 6,715,871 B2* | 4/2004 | Hashimoto et al. | 347/102 |
| 6,841,192 B2* | 1/2005 | Hashimoto et al. | 427/100 |
| 7,029,960 B2* | 4/2006 | Hashimoto et al. | 438/164 |
| 7,087,844 B2* | 8/2006 | Ishimaru et al. | 174/250 |
| 7,212,271 B2* | 5/2007 | Sonoda et | 349/146 |
| 2003/0040164 A1* | 2/2003 | Inoue et al. | 438/438 |
| 2003/0190419 A1* | 10/2003 | Katagami et al. | 427/240 |
| 2004/0209190 A1* | 10/2004 | Mori et al. | 430/311 |

FOREIGN PATENT DOCUMENTS

| | | | |
|---|---|---|---|
| JP | 2003-265997 A | 9/2003 |
| JP | 2002-164635 A | 11/2003 |
| JP | 2003-318514 A | 11/2003 |
| JP | 2004-095896 A | 3/2004 |
| JP | 2005-012181 A | 1/2005 |

OTHER PUBLICATIONS

Tannas, Jr., Lawrence E.; Flat-Panel Displays and CRT's; Van Nostrand Reinhold Company Inc., 1985; p. 438-440.*

* cited by examiner

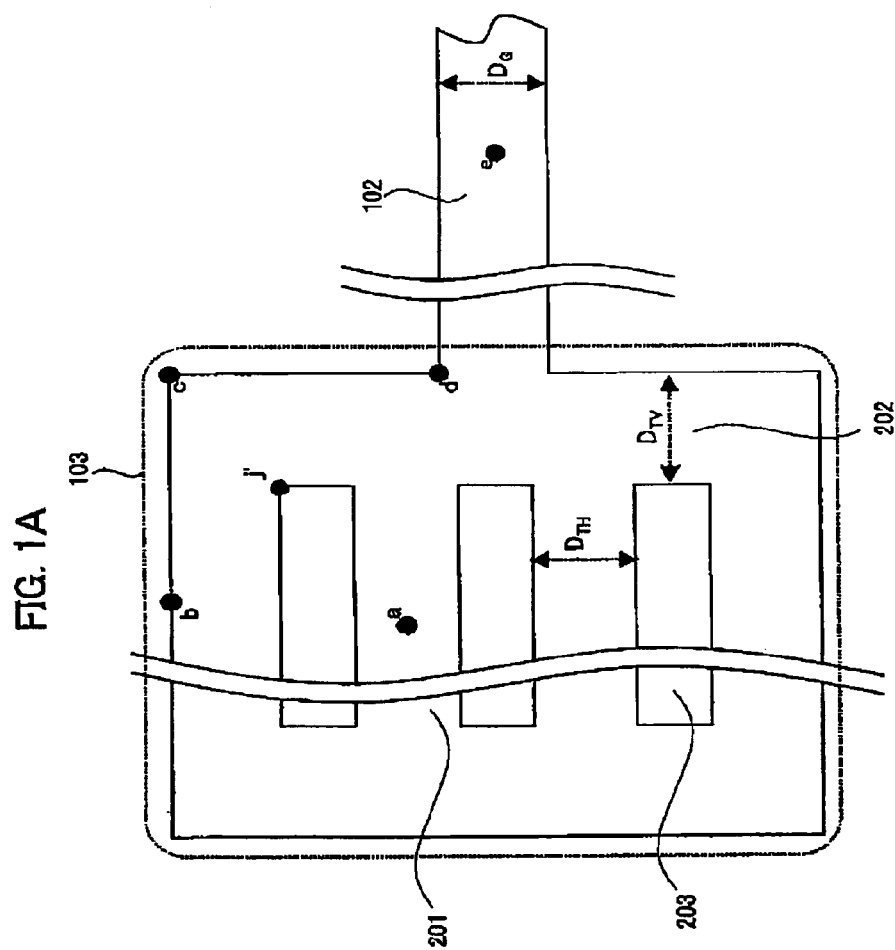

FIG. 1B

EXAMPLE OF DESIGN

| PARAMETER | VALUE |
|---|---|
| $D_{TB}$ | $D_G$ |
| $D_{FV}$ | $D_G$ |

FIG. 1C

COMPARISON OF INTERNAL PRESSURE

| FEATURE POINT | INTERNAL PRESSURE OF LIQUID | |
|---|---|---|
| | BACKGROUND ART | THIS EMBODIMENT |
| a | 0.1 | 1.0 |
| b | 0.1 | 1.0 |
| c | 5.1 | 5.8 |
| d | -4.3 | -4.3 |
| e (REFERENCE) | 1.0 | 1.0 |

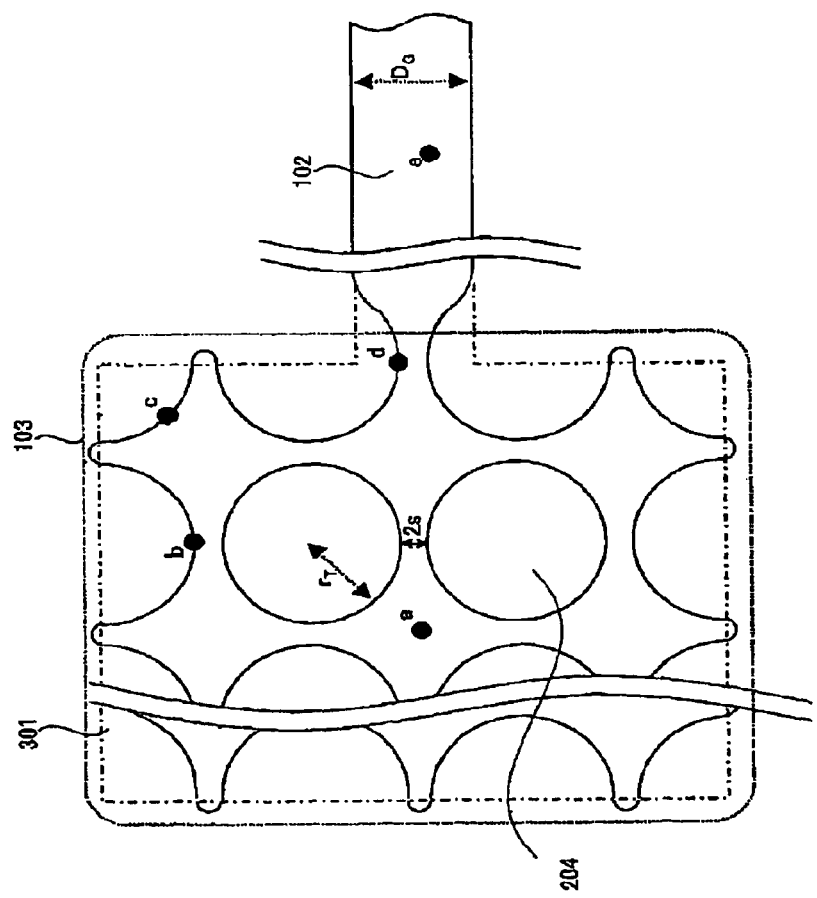

FIG. 2B

EXAMPLE OF DESIGN

| PARAMETER | VALUE |
|---|---|
| $r_T$ | $1.5D_G$ |
| $2s$ | $0.8D_G$ |

FIG. 2C

COMPARISON OF INTERNAL PRESSURE

| FEATURE POINT | INTERNAL PRESSURE OF LIQUID | |
|---|---|---|
| | BACKGROUND ART | THIS EMBODIMENT |
| a | 0.1 | 0.8 |
| b | 0.1 | 0.9 |
| c | 5.1 | 0.1 |
| d | -4.3 | 0.9 |
| e (REFERENCE) | 1.0 | 1.0 |

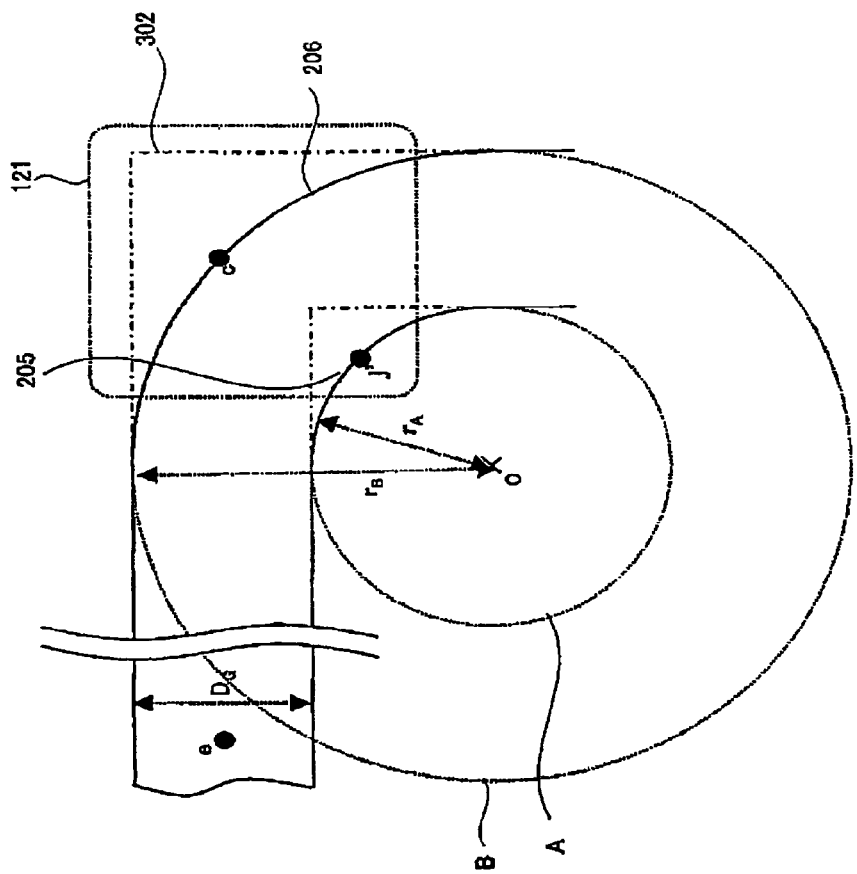

FIG. 3B

EXAMPLE OF DESIGN

| PARAMETER | VALUE |
|---|---|
| $r_A$ | $2D_3$ |
| $r_B$ | $3D_3$ |

FIG. 3C

COMPARISON OF INTERNAL PRESSURE

| FEATURE POINT | INTERNAL PRESSURE OF LIQUID | |
|---|---|---|
| | BACKGROUND ART | THIS EMBODIMENT |
| c | 5.8 | 1.2 |
| j' | -4.3 | 0.8 |
| e (REFERENCE) | 1.0 | 1.0 |

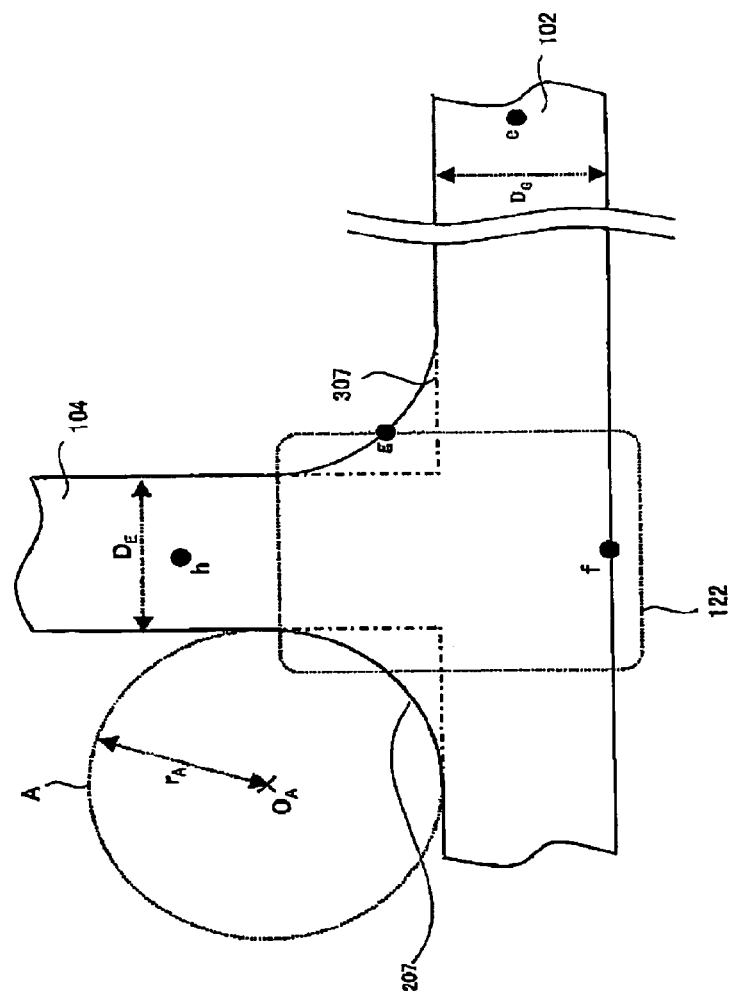

FIG. 4B

EXAMPLE OF DESIGN

| PARAMETER | VALUE |
|---|---|
| $r_A$ | $2D_G$ |
| $D_E$ | $D_G$ |

FIG. 4C

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 0.0 |
| h | 2.0 | 1.0 |
| e (REFERENCE) | 1.0 | 1.0 |

FIG. 5B

EXAMPLE OF DESIGN

| PARAMETER | VALUE |
|---|---|
| $r_A$ | $2D_G$ |
| $r_C$ | $2D_B$ |
| $D_G'$ | $0.8D_G$ |
| $D_B$ | $D_G$ |

FIG. 5C

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 1.0 |
| h | 2.0 | 1.0 |
| e (REFERENCE) | 1.0 | 1.0 |

FIG. 6B

EXAMPLE OF DESIGN

| PARAMETER | VALUE |
|---|---|
| $r_A$ | $0.8 D_G$ |
| $r_D$ | $0.8 D_G$ |
| $D_G'$ | $0.6 D_G$ |
| $D_G''$ | $0.6 D_G$ |
| $D_E$ | $D_G$ |

FIG. 6C

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 1.0 |
| h | 2.0 | 1.0 |
| e (REFERENCE) | 1.0 | 1.0 |

FIG. 7B

EXAMPLE OF DESIGN

| PARAMETER | VALUE |
|---|---|
| $r_A$ | $0.8 D_G$ |
| $r_D$ | $0.8 D_G$ |
| $D_G'$ | $0.6 D_G$ |
| $D_G''$ | $1.2 D_G$ |
| $D_E$ | $D_G$ |

FIG. 7C

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | −4.3 | 1.1 |
| h | 2.0 | 1.0 |
| e (REFERENCE) | 1.0 | 1.0 |

FIG. 8B

EXAMPLE OF DESIGN

| PARAMETER | VALUE |
|---|---|
| $r_A$ | $0.8 D_G$ |
| $r_D$ | $0.8 D_G$ |
| $D_G'$ | $0.6 D_G$ |
| $D_G''$ | $0.6 D_G$ |
| $D_E$ | $D_G$ |
| $D_F$ | $D_G$ |

FIG. 8C

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 1.0 |
| h | 2.0 | 1.0 |
| e (REFERENCE) | 1.0 | 1.0 |

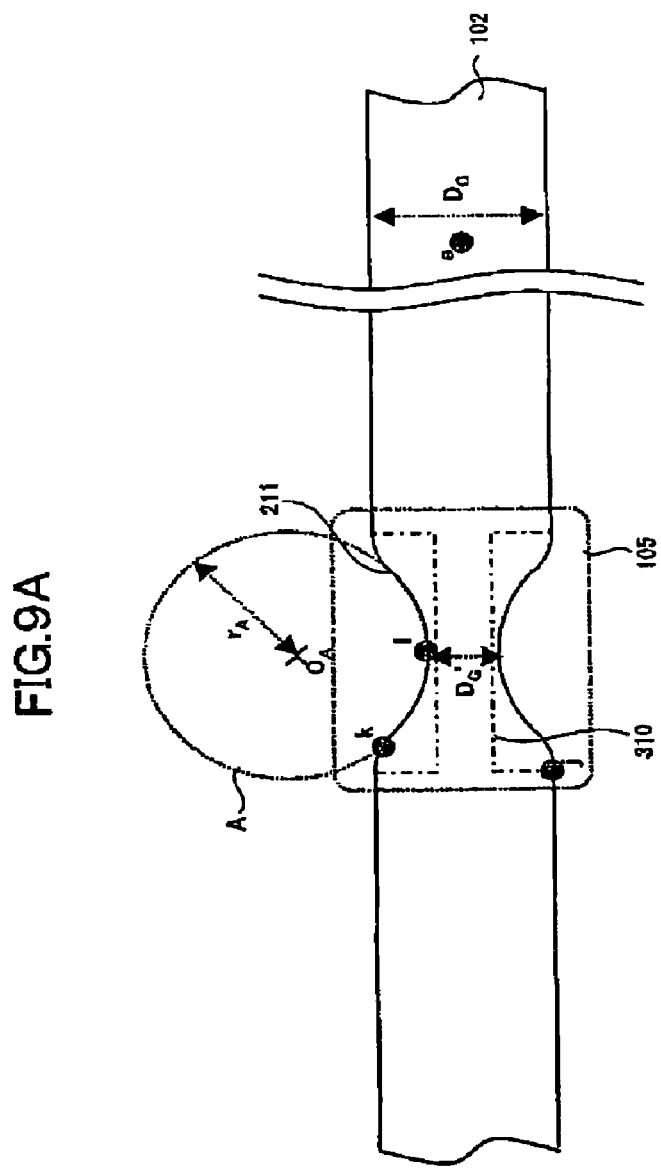

FIG. 9B

EXAMPLE OF DESIGN

| PARAMETER | VALUE |
|---|---|
| $r_A$ | $1.5D_G$ |
| $D_G'$ | $0.5D_G$ |

FIG. 9C

COMPARISON OF INTERNAL PRESSURE

| FEATURE POINT | INTERNAL PRESSURE OF LIQUID | |
|---|---|---|
| | BACKGROUND ART | THIS EMBODIMENT |
| j | 5.8 | 1.0 |
| k | -3.7 | 1.7 |
| l | 2.0 | 1.7 |
| e (REFERENCE) | 1.0 | 1.0 |

FIG. 10B

EXAMPLE OF DESIGN

| PARAMETER | VALUE |
|---|---|
| $D_C$ | $2D_G$ |

FIG. 10C

COMPARISON OF INTERNAL PRESSURE

| FEATURE POINT | INTERNAL PRESSURE OF LIQUID | |
|---|---|---|
| | BACKGROUND ART | THIS EMBODIMENT |
| m | 2.0 | 1.0 |
| e (REFERENCE) | 1.0 | 1.0 |

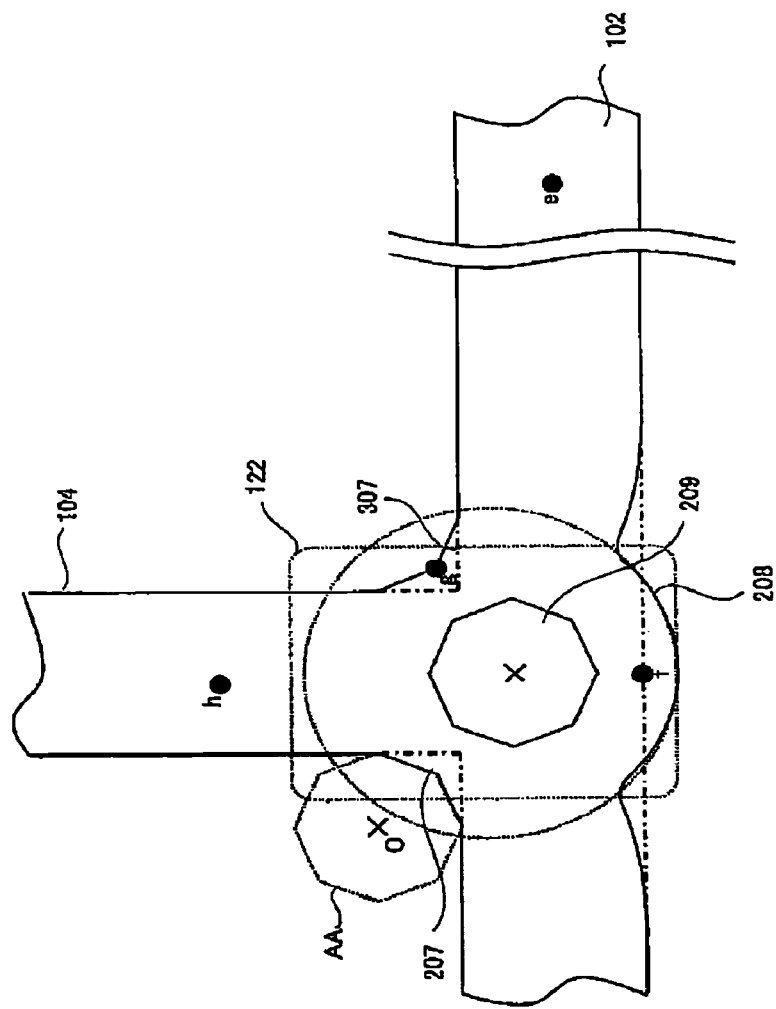

FIG. 22A

<EMBODIMENT 1>

EXAMPLE OF DESIGN

| PARAMETER | VALUE |
|---|---|
| $D_{TH}$ | $D_a$ |
| $D_{TV}$ | $D_G$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| a | 0.1 | 1.0 |
| b | 0.1 | 1.0 |
| c | 5.1 | 5.8 |
| d | -4.3 | -4.3 |
| e (REFERENCE) | 1.0 | 1.0 |

<EMBODIMENT 2>

EXAMPLE OF DESIGN

| PARAMETER | VALUE |
|---|---|
| $r_e$ | $2D_G$ |
| $2s$ | $1.0D_G$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| a | 0.1 | 0.7 |
| b | 0.1 | 0.7 |
| c | 5.1 | 0.0 |
| d | -4.3 | 0.7 |
| e (REFERENCE) | 1.0 | 1.0 |

<EMBODIMENT 3>

EXAMPLE OF DESIGN

| PARAMETER | VALUE |
|---|---|
| $r_a$ | $3D_G$ |
| $r_B$ | $4D_G$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| 1' | -4.3 | 0.8 |
| c | 5.8 | 1.2 |
| e (REFERENCE) | 1.0 | 1.0 |

<EMBODIMENT 4>

EXAMPLE OF DESIGN

| PARAMETER | VALUE |
|---|---|
| $r_a$ | $2D_G$ |
| $D_a$ | $D_B$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 0.0 |
| h | 2.0 | 1.0 |
| e (REFERENCE) | 1.0 | 1.0 |

FIG. 22B

<EMBODIMENT 5>

EXAMPLE OF DESIGN

| PARAMETER | VALUE |
|---|---|
| $r_A$ | $1D_D$ |
| $r_C$ | $1D_C$ |
| $D_C'$ | $0.6D_C$ |
| $D_B$ | $D_B$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 1.0 |
| h | 2.0 | 1.0 |
| e (REFERENCE) | 1.0 | 1.0 |

<EMBODIMENT 6>

EXAMPLE OF DESIGN

| PARAMETER | VALUE |
|---|---|
| $r_A$ | $D_B$ |
| $r_D$ | $D_B$ |
| $D_C'$ | $0.6D_B$ |
| $D_C''$ | $D_B$ |
| $D_B$ | $D_B$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 1.0 |
| h | 2.0 | 1.0 |
| e (REFERENCE) | 1.0 | 1.0 |

<EMBODIMENT 7>

EXAMPLE OF DESIGN

| PARAMETER | VALUE |
|---|---|
| $r_A$ | $D_B$ |
| $r_D$ | $D_B$ |
| $D_C'$ | $0.6D_B$ |
| $D_C''$ | $1.4D_B$ |
| $D_B$ | $D_B$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 1.0 |
| h | 2.0 | 1.0 |
| e (REFERENCE) | 1.0 | 1.0 |

<EMBODIMENT 8>

EXAMPLE OF DESIGN

| PARAMETER | VALUE |
|---|---|
| $r_A$ | $D_B$ |
| $r_D$ | $D_B$ |
| $D_C'$ | $0.6D_B$ |
| $D_C''$ | $0.6D_B$ |
| $D_E$ | $D_B$ |
| $D_F$ | $D_B$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 1.0 |
| h | 2.0 | 1.0 |
| e (REFERENCE) | 1.0 | 1.0 |

FIG. 22C

<EMBODIMENT 9>

EXAMPLE OF DESIGN

| PARAMETER | VALUE |
|---|---|
| $r_A$ | $2D_C$ |
| $D_C'$ | $0.5D_G$ |

COMPARISON OF INTERNAL PRESSURE

| FEATURE POINT | INTERNAL PRESSURE OF LIQUID | |
| --- | --- | --- |
| | BACKGROUND ART | THIS EMBODIMENT |
| j | 5.8 | 1.0 |
| k | -3.7 | 1.7 |
| l | 2.0 | 1.7 |
| e (REFERENCE) | 1.0 | 1.0 |

<EMBODIMENT 10>

EXAMPLE OF DESIGN

| PARAMETER | VALUE |
|---|---|
| $D_C$ | $2.4D_G$ |

COMPARISON OF INTERNAL PRESSURE

| FEATURE POINT | INTERNAL PRESSURE OF LIQUID | |
| --- | --- | --- |
| | BACKGROUND ART | THIS EMBODIMENT |
| m | 2.0 | 1.0 |
| e (REFERENCE) | 1.0 | 1.0 |

FIG. 23A

<EMBODIMENT 1>

EXAMPLE OF DESIGN

| PARAMETER | VALUE |
|---|---|
| $D_u$ | $D_q$ |
| $D_v$ | $D_q$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| a | 0.1 | 1.0 |
| b | 0.1 | 1.0 |
| c | 5.1 | 5.8 |
| d | -4.3 | -4.3 |
| e (REFERENCE) | 1.0 | 1.0 |

<EMBODIMENT 2>

EXAMPLE OF DESIGN

| PARAMETER | VALUE |
|---|---|
| $r_T$ | $3D_q$ |
| $2s$ | $0.8D_q$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| a | 0.1 | 0.6 |
| b | 0.1 | 0.8 |
| c | 5.1 | -0.2 |
| d | -4.3 | 0.8 |
| e (REFERENCE) | 1.0 | 1.0 |

<EMBODIMENT 3>

EXAMPLE OF DESIGN

| PARAMETER | VALUE |
|---|---|
| $r_1$ | $6D_q$ |
| $r_2$ | $7D_q$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| 1' | -4.3 | 0.8 |
| c | 5.8 | 1.2 |
| e (REFERENCE) | 1.0 | 1.0 |

<EMBODIMENT 4>

EXAMPLE OF DESIGN

| PARAMETER | VALUE |
|---|---|
| $r_A$ | $10D_q$ |
| $D_r$ | $D_q$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | -4.3 | 0.0 |
| h | 2.0 | 1.0 |
| e (REFERENCE) | 1.0 | 1.0 |

FIG. 23B

<EMBODIMENT 5>

EXAMPLE OF DESIGN

| PARAMETER | VALUE |
|---|---|
| $r_A$ | $1D_0$ |
| $r_C$ | $1D_0$ |
| $D_0'$ | $0.4D_0$ |
| $D_E$ | $D_0$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | −4.3 | 1.0 |
| h | 2.0 | 1.0 |
| e (REFERENCE) | 1.0 | 1.0 |

<EMBODIMENT 6>

EXAMPLE OF DESIGN

| PARAMETER | VALUE |
|---|---|
| $r_A$ | $2.3D_0$ |
| $r_B$ | $2.3D_0$ |
| $D_0'$ | $0.6D_0$ |
| $D_0''$ | $D_0$ |
| $D_E$ | $D_0$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | −4.3 | 1.0 |
| h | 2.0 | 1.0 |
| e (REFERENCE) | 1.0 | 1.0 |

<EMBODIMENT 7>

EXAMPLE OF DESIGN

| PARAMETER | VALUE |
|---|---|
| $r_A$ | $2.5D_0$ |
| $r_B$ | $2.5D_0$ |
| $D_0'$ | $0.6D_0$ |
| $D_0''$ | $1.6D_0$ |
| $D_E$ | $D_0$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.1 |
| g | −4.3 | 1.0 |
| h | 2.0 | 1.0 |
| e (REFERENCE) | 1.0 | 1.0 |

<EMBODIMENT 8>

EXAMPLE OF DESIGN

| PARAMETER | VALUE |
|---|---|
| $r_A$ | $2.2D_0$ |
| $r_B$ | $2.2D_0$ |
| $D_0'$ | $0.6D_0$ |
| $D_0''$ | $0.6D_0$ |
| $D_F$ | $D_0$ |
| $D_E$ | $D_0$ |

COMPARISON OF INTERNAL PRESSURE

| FEATURE POINT | INTERNAL PRESSURE OF LIQUID | |
|---|---|---|
| | BACKGROUND ART | THIS EMBODIMENT |
| f | 1.0 | 1.0 |
| g | −4.3 | 1.0 |
| h | 2.0 | 1.0 |
| e (REFERENCE) | 1.0 | 1.0 |

FIG. 23C

<EMBODIMENT 9>

EXAMPLE OF DESIGN

| PARAMETER | VALUE |
|---|---|
| $r_A$ | $2.5D_G$ |
| $D_G'$ | $0.4D_G$ |

COMPARISON OF INTERNAL PRESSURE

| FEATURE POINT | INTERNAL PRESSURE OF LIQUID | |
| | BACKGROUND ART | THIS EMBODIMENT |
|---|---|---|
| j | 5.8 | 1.3 |
| k | -3.7 | 1.8 |
| l | 2.0 | 1.9 |
| e (REFERENCE) | 1.0 | 1.0 |

<EMBODIMENT 10>

EXAMPLE OF DESIGN

| PARAMETER | VALUE |
|---|---|
| $D_C$ | $4D_G$ |

COMPARISON OF INTERNAL PRESSURE

| FEATURE POINT | INTERNAL PRESSURE OF LIQUID | |
| | BACKGROUND ART | THIS EMBODIMENT |
|---|---|---|
| m | 2.0 | 1.0 |
| e (REFERENCE) | 1.0 | 1.0 |

FIG. 25B

| FEATURE POINT | INTERNAL PRESSURE OF LIQUID |
|---|---|
| a | 0.1 |
| b | 0.1 |
| c | 5.1 |
| d | -4.3 |
| e (REFERENCE) | 1.0 |
| f | 1.0 |

FIG. 25C

| FEATURE POINT | INTERNAL PRESSURE OF LIQUID |
|---|---|
| g | -4.3 |
| h | 2.0 |
| i | 5.8 |
| j | 5.8 |
| k | -3.7 |
| l | 2.0 |
| m | 2.0 |

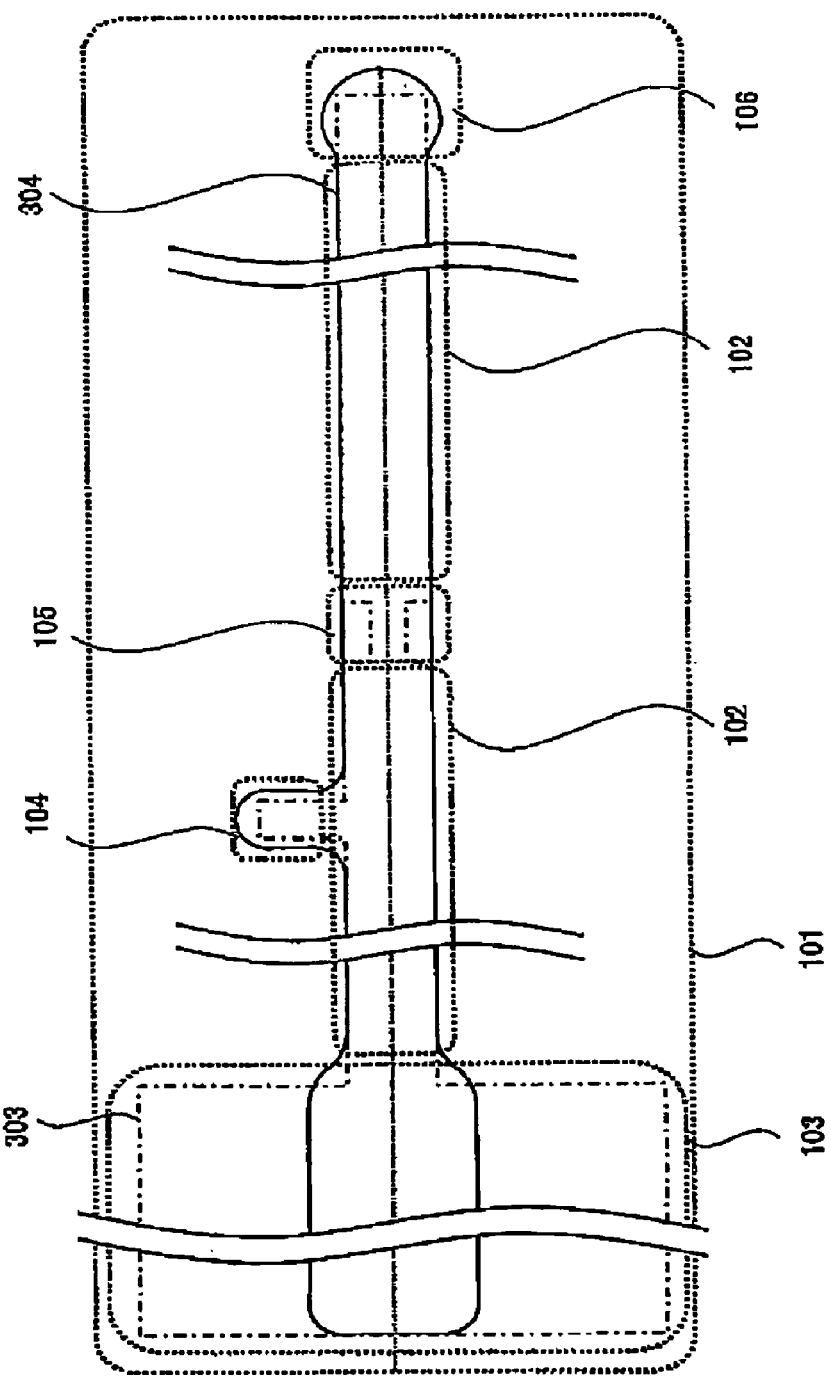

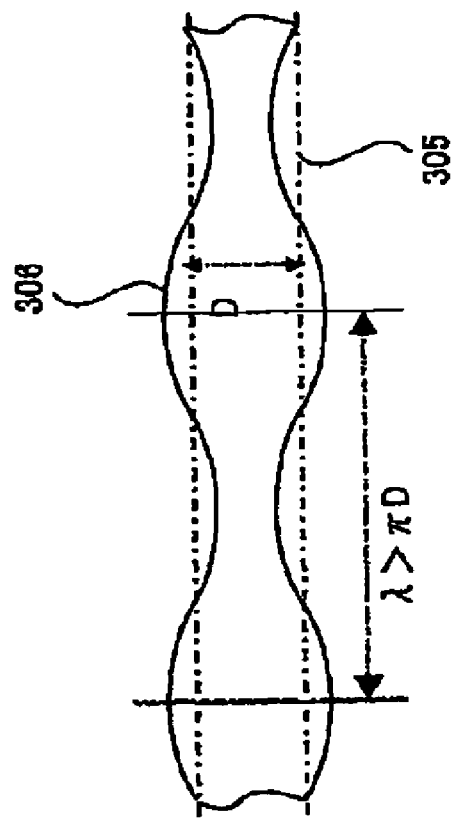

SUBSTRATE WITH PLANE PATTERNS AND DISPLAY DEVICE USING THE SAME

FIELD OF THE INVENTION

The present invention relates to a substrate constituting a flat panel type display device and having plane patterns formed thereon, and a display device using the substrate, and particularly relates to a substrate in which plane patterns of scanning lines, video lines, source electrodes, semiconductor layers, pixel electrodes, etc. in a display panel constituting a flat panel type display device such as a liquid crystal display device or an organic EL display device are formed in a liquid process such as an inkjet method, and a display device using the substrate.

BACKGROUND OF THE INVENTION

For example, in a flat panel type display device such as a liquid crystal display device or an organic EL display device, a display panel constituting the display device has a display region in which a large number of pixels are arrayed in a matrix on a substrate. An active matrix display panel is used broadly as the display panel. In the active matrix display panel, TFT (Thin Film Transistor) devices are provided as switching devices for the pixels arrayed in the display region respectively. Here, a liquid crystal display device will be described as a typical example of such a flat panel type display device.

A display panel constituting an active matrix liquid crystal display device (hereinafter referred to as "liquid crystal panel") has plane patterns on an opposed surface or opposed surfaces of one or both of a pair of insulating substrates preferably made of glass. A liquid crystal layer is sandwiched between the opposed substrates. TFT devices, pixel electrodes for display, electrodes for applying scanning signals or video signals to the TFT devices, scanning signal lines for transmitting the scanning signals, video signal lines for transmitting the video signals, terminal portions for connecting these signal lines to external drive circuits, etc. are formed on one of the substrates (TFT substrate).

A color filter, a black matrix and an opposed electrode are formed on the other substrate (CF (Color Filter) substrate). There are some available display systems such as a TN (Twisted Nematic) system in which an electric field substantially perpendicular to the liquid crystal sandwiched between the plane patterns of the opposed substrates (also referred to as "vertical electric field") is applied for display, an IPS (In-Plane Switching) system in which a lateral electric field substantially parallel to the plane patterns is applied for display, etc.

The scanning signal lines, the scanning signal electrodes, the terminal portions for connecting the scanning signal lines with an external drive circuit, the video signal lines, the video signal electrodes, the terminal portions for connecting the video signal lines to an external drive circuit, etc., which are used in the active matrix liquid crystal device, are generally produced as plane patterns by patterning a conductive thin film material such as metal. In the background art, the plane patterns are produced in the following manner. That is, a thin film of metal or the like is formed all over the surface of a substrate in a film forming method such as a sputtering method or a vapor deposition method, and the thin film is processed into a desired shape in a photolithographic process or an etching process.

In addition to the aforementioned background-art technique, there has been proposed a technique for forming plane patterns of wiring or the like in a liquid process using an inkjet apparatus or the like. According to this forming method, the throughput can be improved on a large scale while the cost can be reduced. For example, when wiring patterns are to be formed in a liquid process, ink of a solvent mixed with metal is ejected only to portions where the wiring patterns should be formed. After that, the solvent is evaporated by heat applied thereto, and sintering is performed. Thus, desired wiring patterns can be obtained.

When such a liquid process is used, the photolithographic process and the etching process are dispensable so that the number of processes can be reduced. Since patterns can be formed only in necessary portions due to the liquid process, the cost of materials can be also suppressed so that the cost can be reduced. In addition, the film thickness can be increased without lowering the throughput, so that the resistance of wiring can be lowered easily. Further, since etchant such as acid or alkali to be used in an etching process is dispensable, the load on environment can be also reduced.

As a background-art technique relating to patterning of wiring or the like using an inkjet method which is a typical liquid process technique, JP-A-2000-353594 discloses a film forming technique in which banks are built up on a substrate so as to form grooves in the substrate surface, and the grooves are filled with a thin film material liquid in an inkjet method so as to form a thin film.

According to the inkjet method, a solution including pigment or the like (hereinafter referred to as "ink") is ejected from nozzles so as to drop onto a substrate to thereby form patterns. The ink is dried or fired to be hardened. Thus, desired patterns can be obtained. Just after the ink lands on the substrate, the ink shows behavior like liquid due to a solvent included therein. When the liquid is dropped onto the substrate, the liquid flows to make its internal pressure constant and reduce its surface area, so that plane patterns are changed. Thus, some kind of pattern is formed into a shape different from a desired shape of the pattern. The fact that the pattern has a shape different from a desired shape means that there occurs an abnormal pattern. For example, liquid may overflow in a tail portion of a pattern, liquid may overflow in a part of a linear pattern, liquid may overflow in a bent portion, or the film thickness may vary due to the shape of a pattern.

SUMMARY OF THE INVENTION

It is an object of the present invention to provide a substrate with high-precision plane patterns by which occurrence of an abnormal pattern is reduced or prevented in any pattern formed in a liquid process such as an inkjet method, and a display device using the substrate.

The present invention is characterized in that the plane patterns are formed based on a combination of plane shapes by which a difference in internal pressure of liquid ejected onto a substrate between any two points of the liquid is small, and the surface area of the liquid is reduced.

As for the behavior of droplets dropped onto the substrate, description will be made below about occurrence of an abnormal pattern caused by a flow of the liquid due to a difference in internal pressure of the dropped droplets, and occurrence of an abnormal pattern caused by a flow of the liquid due to stability of the surface energy. First, the internal pressure of the liquid will be described with reference to FIG. 24.

FIG. 24 is a diagram for explaining the internal pressure of liquid. Internal pressure Pz of liquid 500 shown in FIG. 24 at the point Z of the liquid 500 can be expressed by the following expression (1) when $\gamma_L$ designates the surface tension of the liquid, Rx designates the curvature radius of the liquid on a plane including an axis x and the point Z, and Ry designates the curvature radius of the liquid on a plane perpendicular to the aforementioned plane.

$$P_Z = \gamma_L(1/R_x + 1/R_y) = \gamma_L \cdot C \quad (1)$$

where C designates a curvature

The liquid flows so that the internal pressure of the liquid shown in the aforementioned expression (1) becomes equal between any two points of the surface of the liquid. Thus, the shape of the liquid is changed. Since the surface tension $\gamma_L$ has a value proper to the liquid, the curvature C changes to relax the internal pressure of the liquid. Specifically, the curvature C is reduced in a site where the internal pressure is high. On the contrary, the curvature C is increased in a site where the internal pressure is low. As a result, there occurs an abnormal pattern different from a desired pattern. Based on the aforementioned fact, the internal pressures of the liquid at points are compared with one another with reference to FIGS. 25A-25C when a scanning line pattern of a display panel is formed by way of example.

FIGS. 25A-25C are diagrams for explaining an example of a plane pattern of a scanning line of a display panel formed by a photolithographic process and an etching process on a metal film formed in a sputtering method. FIG. 25A shows the plane pattern of the scanning line. FIGS. 25B and 25C are comparative tables of internal pressures of liquid in feature points of the plane pattern of the scanning line in FIG. 25A. Points a to m in FIG. 25A are feature points for comparing internal pressures of liquid of a scanning line 101 with one another.

The scanning line 101 can be divided into a terminal portion 103, a scanning signal line 102 and a terminal portion 106. Further, the scanning signal line 102 involves a scanning signal electrode 104 and a crossing portion 105. The terminal portion 103 is formed in at least one end portion of one scanning line 101 so as to connect with an external drive circuit. The pattern width of the terminal portion 103 is generally formed to be wider than the width of the scanning signal line 102. The scanning signal line 102 is a line through which a signal applied from the terminal portion 103 is transmitted to the scanning signal electrode 104. The scanning signal line 102 occupies a major part of the scanning line.

A thin film transistor (TFT) is formed above the scanning signal electrode 104. A voltage for turning ON/OFF the TFT is applied to the scanning signal electrode 104. Such scanning signal electrodes 104 are disposed at even intervals correspondingly to TFTs existing in a lateral direction (extending direction of the scanning signal line 102). The width and length of each scanning signal electrode 104 depends on the dimensions of each TFT to be manufactured.

The crossing portion 105 is disposed to reduce the capacitance with a video signal line formed above the scanning signal electrode. Such crossing portions 105 are also disposed at even intervals correspondingly to the TFTs existing in the lateral direction. The width of each crossing portion 105 is generally made as narrow as possible because the crossing portion 105 is provided to reduce the capacitance. The length of the crossing portion 105 depends on the line width of the video signal line and the alignment accuracy of photolithography. The terminal portion 106 is a literal portion corresponding to the terminal of the scanning signal line 102. The width of the terminal portion 106 is generally equal to that of the scanning signal line 102.

Each feature point shown in FIG. 25A is a point defined to evaluate the internal pressure of the liquid. As for the feature of each point, a point a is at the center of the terminal portion 103; a point b is in a pattern boundary of the terminal portion 103; a point c is in a corner of the terminal portion 103; a point d is a corner of a connection portion between the terminal portion 103 and the scanning signal line 102; a point e is at the center of the scanning signal line 102; a point f is in a surface opposed to a portion where the scanning signal electrode 104 is connected; a point g is in a corner of a connection portion between the scanning signal line 102 and the scanning signal electrode 104; a point h is at the center of the scanning signal electrode 104; a point i is in a corner of the scanning signal electrode 104; a point j is in a corner of a convex portion of a connection portion between the scanning signal line 102 and the crossing portion 105; a point k is in a corner of a concave portion of the connection portion between the scanning signal line 102 and the crossing portion 105; a point l is in a pattern boundary of the crossing portion 105; and a point m is in a pattern boundary of the terminal portion 106 of the scanning signal line 102. The internal pressure of the liquid at each of these points will be evaluated.

When the pattern shown in FIGS. 25A-25C is formed out of liquid, the internal pressures of the liquid at the feature points are compared with the internal pressure of the liquid at the feature point e. As shown in FIGS. 25B and 25C, the internal pressures are evaluated as follows.

liquid internal pressure higher than that at feature point e: c, h, i, j, l, m liquid internal pressure equal to that at feature point e: f liquid internal pressure lower than that at feature point e: a, b, d, g, k Thus, the liquid flows to relax the internal pressure difference of the liquid.

FIG. 26 is a diagram for explaining a scanning line plane pattern 303 just after the liquid is ejected and a scanning line plane pattern 304 deformed due to a flow of the liquid caused by an internal pressure difference of the liquid. The scanning line plane pattern 304 deformed due to a flow of the liquid caused by an internal pressure difference of the liquid changes in accordance with its regions as follows.

terminal portion 103: Pattern width is narrowed, and corner portions expand outside.

scanning signal electrode 104: Pattern width changes to be wider, and corner portions expand outside.

crossing portion 105: Pattern width changes to be wider, and becomes equal to the width of the scanning signal line 102.

terminal portion 106: Pattern width changes to be wider, and corner portions expand outside.

Therefore, when a plane pattern is formed in a liquid process such as an inkjet method, an abnormal pattern may occur if a plane pattern to be used for forming wiring in a sputtering method or the like is used as it is. Thus, it is likely that stability in manufacturing cannot be secured. In order to secure stability in manufacturing, it is essential to apply a plane pattern by which the difference in internal pressure of the liquid among the feature points can be reduced or eliminated.

Next, occurrence of an abnormal pattern caused by a flow of liquid due to the stability of surface energy of the liquid will be described with reference to FIG. 27. FIG. 27 is a diagram for explaining a linear pattern 305 just after liquid is ejected and a linear pattern 306 deformed due to a flow of the liquid caused by the stability of the surface energy. Compare the surface energy of the deformed linear pattern 306 with that of the linear pattern 305 obtained just after the ejection. The surface energy of the deformed linear pattern 306 becomes lower than that of the linear pattern 305 when the wavelength $\lambda$ of the deformed linear pattern 306 satisfies the following expression (2).

$$\lambda > \pi D$$

This is known as Rayleigh-Plateau instability. The liquid is deformed from the linear pattern 305 to the linear pattern 306 so as to have a stable shape. It is known that the wavelength λ of the deformed linear pattern 306 is apt to be:

$$\lambda = \sqrt{2}\pi D \quad (3)$$

Therefore, when a pattern is formed in a liquid process such as an inkjet method, an abnormal pattern may occur if a plane pattern to be used for forming wiring in a sputtering method or the like is used as it is. Thus, there is a fear that stability in manufacturing cannot be secured. In order to secure stability in manufacturing, it is essential to apply a plane pattern by which the surface energy of each droplet is minimized.

That is, a substrate with plane patterns formed using a liquid process according to the present invention is characterized in that the plane patterns are formed based on a combination of plane shapes by which a difference in internal pressure of liquid (solution of a pattern forming material) ejected onto a substrate so as to form the plane patterns is small between any two points of the liquid. The plane shapes are formed based on plane shapes by which the surface area of the liquid is minimized.

According to the present invention, in wiring patterns formed using a liquid process such as an inkjet method, the wiring patterns are formed by a combination of plane patterns by which the internal pressure of the liquid is constant in the plane patterns and the surface area of the liquid is minimized. Thus, it is possible to obtain a substrate in which occurrence of an abnormal pattern at the time of manufacturing is reduced or prevented. A display device (display panel) is constructed using the substrate having the plane patterns as wiring patterns. Thus, it is possible to obtain a low-cost and high-quality display device.

BRIEF DESCRIPTION OF THE DRAWINGS

FIGS. 1A-1C are diagrams for explaining Embodiment 1 of the present invention;
FIGS. 2A-2C are diagrams for explaining Embodiment 2 of the present invention;
FIGS. 3A-3C are diagrams for explaining Embodiment 3 of the present invention;
FIGS. 4A-4C are diagrams for explaining Embodiment 4 of the present invention;
FIGS. 5A-5C are diagrams for explaining Embodiment 5 of the present invention;
FIGS. 6A-6C are diagrams for explaining Embodiment 6 of the present invention;
FIGS. 7A-7C are diagrams for explaining Embodiment 7 of the present invention;
FIGS. 8A-8C are diagrams for explaining Embodiment 8 of the present invention;
FIGS. 9A-9C are diagrams for explaining Embodiment 9 of the present invention;
FIGS. 10A-10C are diagrams for explaining Embodiment 10 of the present invention;
FIG. 21 is a diagram for explaining another plane pattern of a T portion formed in an inkjet method;
FIG. 22A is a view for diagrams for explaining design values of a plane pattern and internal pressure values in the plane pattern when the contact angle between each substrate according to Embodiments 1-4 and liquid is set to be 50°;
FIG. 22B is a view for diagrams for explaining design values of a plane pattern and internal pressure values in the plane pattern when the contact angle between each substrate according to Embodiments 5-8 and liquid is set to be 50°;
FIG. 22C is a view for diagrams for explaining design values of a plane pattern and internal pressure values in the plane pattern when the contact angle between each substrate according to Embodiments 9-10 and liquid is set to be 50°;
FIG. 23A is a view for diagrams for explaining design values of a plane pattern and internal pressure values in the plane pattern when the contact angle between each substrate according to Embodiments 1-4 and liquid is set to be 20°;
FIG. 23B is a view for diagrams for explaining design values of a plane pattern and internal pressure values in the plane pattern when the contact angle between each substrate according to Embodiments 5-8 and liquid is set to be 20°;
FIG. 23C is a view for diagrams for explaining design values of a plane pattern and internal pressure values in the plane pattern when the contact angle between each substrate according to Embodiments 9-10 and liquid is set to be 200;
FIGS. 25A-25C are diagrams for explaining an example of a plane pattern of a scanning line of a display panel formed by a photolithographic process and an etching process on a metal film formed in a sputtering method;
FIG. 26 is a diagram for explaining a scanning line plane pattern just after liquid is ejected and a scanning line plane pattern deformed due to a flow of the liquid caused by an internal pressure difference of the liquid;
and
FIG. 27 is a diagram for explaining a linear pattern just after liquid is ejected and a linear pattern deformed due to a flow of the liquid caused by the stability of the surface energy.

DESCRIPTION OF THE PREFERRED EMBODIMENTS

Figure 5A:
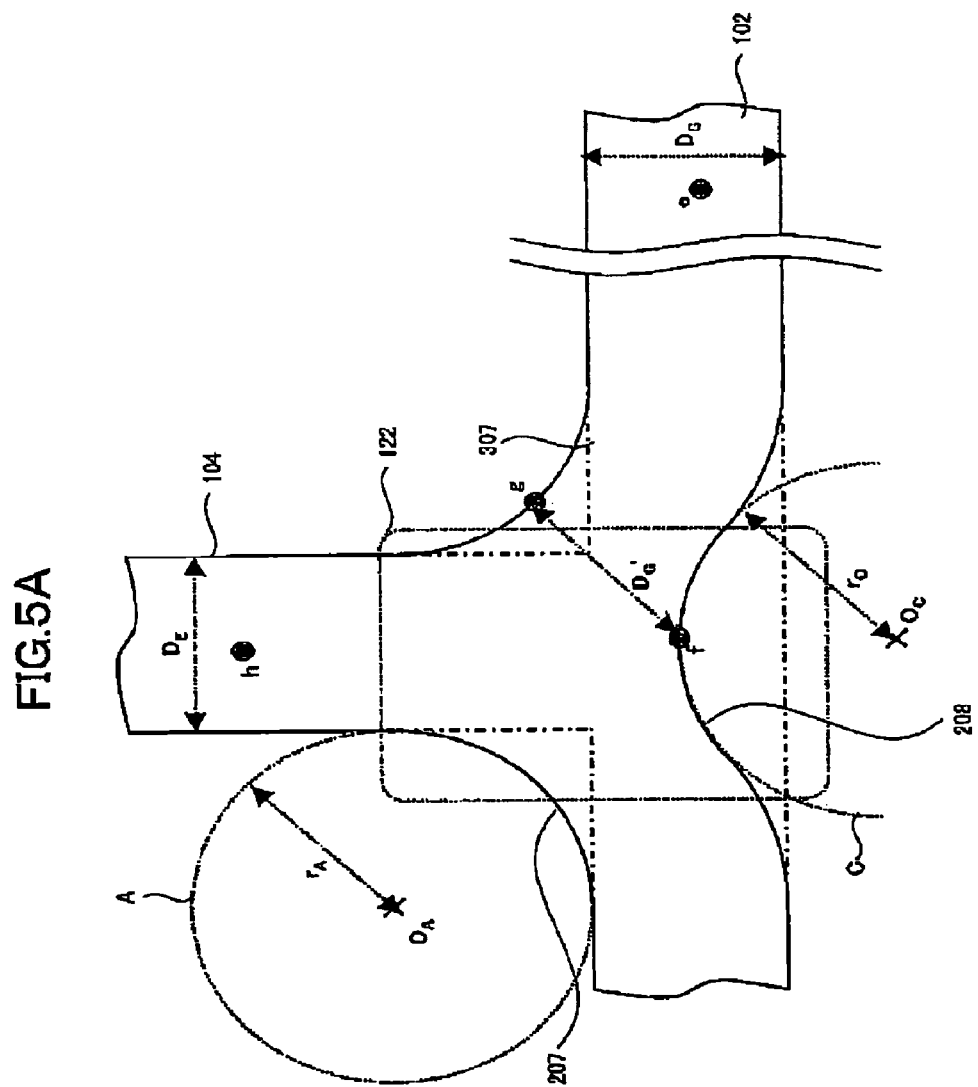

A substrate with plane patterns formed in consideration of the aforementioned behavior of droplets and a display device using the substrate will be described below with reference to their embodiments. In the following embodiments, a substrate with wiring patterns formed by dropping wiring material ink (also referred to as "liquid" or "solution") by inkjet and a display device using the substrate will be described by way of example. In addition, the following embodiments will be described on the assumption that the contact angle between the substrate and the wiring material ink is 90 degrees (°).

FIGS. 1A-1C are explanatory diagrams of Embodiment 1 of the present invention. FIG. 1A is a plan view showing a plane pattern of a terminal portion 103 formed in an inkjet method. FIG. 1B shows an example of design. FIG. 1C is a comparative table of internal pressure of liquid in feature points. A difference between internal pressure of liquid occurring at each feature point a, b of a terminal portion 103 and that at a feature point e of a scanning signal line 102 is caused by the width of the terminal portion 103 wider than the width of the scanning signal line 102.

In Embodiment 1, rod-like cut patterns 203 are disposed in the terminal portion 103 so as to form the terminal portion 103 into comb tooth patterns 201. A width $D_{TH}$ of each comb tooth pattern 201 is made equal to a width $D_G$ of the scanning signal line 102. The comb tooth patterns 201 are connected with one another through a comb teeth connection pattern 202 formed vertically. Like each comb tooth pattern 201, a width $D_{TV}$ of the comb teeth connection pattern 202 is made equal to the width $D_G$ of the scanning signal line 102.

Application of the plane pattern according to Embodiment 1 improves the pressure at the feature point a, b in FIG. 1A on a large scale so that the pressure at the feature point a, b is 1.0 time as large as that at the feature point e, as compared with the plane pattern according to the background art in which the former is 0.1 time as large as the latter.

According to Embodiment 1, the internal pressure of the liquid at the feature point a, b can be made equal to that at the feature point e. It is therefore possible to reduce the occurrence of abnormal patterns at the time of manufacturing due to a difference in internal pressure of the liquid in the terminal portion 103.

However, the internal pressure of the liquid at the feature point c increases to be 5.8 times as large as that at the feature point e in the plane pattern according to this embodiment, as compared with the plane pattern according to the background art in which the former is 5.1 times as large as the latter. The internal pressure of the liquid at the feature point d is −4.3 times as large as that at the feature point e both in the plane patterns according to the background art and in the plane patterns according to this embodiment. Thus, the difference in internal pressure of the liquid at the feature point c, d may be not relaxed sufficiently. A method for relaxing the difference in internal pressure of the liquid at the feature point c will be described later in Embodiment 3. On the other hand, a method for relaxing the difference in internal pressure of the liquid at the feature point d will be described later in Embodiments 4-8.

In the plane pattern according to Embodiment 1, there is another new feature point j' in the terminal portion 103. The internal pressure of the liquid at the feature point j' is lower than that at the feature point e. As a result, the feature point j' may cause occurrence of an abnormal pattern. A plane pattern to relax the difference in internal pressure of the liquid at the feature point j' will be shown later in Embodiment 3.

FIGS. 2A-2C are explanatory diagrams of Embodiment 2 of the present invention. FIG. 2A is a plan view showing a plane pattern in a terminal portion 103 formed in an inkjet method. FIG. 2B shows an example of design. FIG. 2C is a comparative table of internal pressure of liquid in feature points. The chain line shows a background-art terminal portion plane pattern 301.

In Embodiment 2, circular cut patterns 204 are disposed on a square grille in the terminal portion 103. No pattern is formed in the region of each circular cut pattern 204. Thus, the terminal portion 103 is formed as a wiring pattern with circular holes made therein. The plane pattern is formed so that a radius $r_T$ of each terminal portion circular cut pattern 204 and an interval s between the terminal portion circular cut patterns 204 are $1.5D_G$ and $0.8D_G$ respectively with respect to a width $D_G$ of a scanning signal line 102.

The plane pattern according to Embodiment 2 improves the internal pressure of the liquid at the feature point a on a large scale so that the internal pressure of the liquid at the feature point a is 0.8 times as large as that at the feature point e, as compared with that the plane pattern according to the background art in which the former is 0.1 time as large as the latter. In the same manner, the internal pressure of the liquid at the feature point b, the internal pressure of the liquid at the feature point c and the internal pressure of the liquid at the feature point d are improved from 0.1 time to 0.9 times, from 5.1 times to 0.1 time and from −4.3 times to 0.9 times respectively on a large scale.

According to Embodiment 2, a difference in internal pressure of the liquid between the feature point a, b, c, d and the feature point e can be reduced so that it is possible to reduce the occurrence of abnormal patterns at the time of manufacturing due to the difference in internal pressure of the liquid in the terminal portion 103.

FIGS. 3A-3C are explanatory diagrams of Embodiment 3 of the present invention. FIG. 3A is a plan view showing a plane pattern of a bent portion 121 formed in an inkjet method. FIG. 3B shows an example of design. FIG. 3C is a comparative table of internal pressure of liquid in feature points. The chain line shows a plane pattern 302 near feature points c and j' in the terminal portion 103 in Embodiment 1.

A difference in internal pressure of liquid between the feature point c, j' and the feature point e in the scanning signal line 102 is caused by the discontinuity of a pattern in a corner of the bent portion 121 or a large curvature of the bent portion 121 in spite of the continuity of the pattern. Here, the continuity is defined as that "when a plane pattern is expressed by a function, it is differentiable all over the domain of the function".

In Embodiment 3, chamfering 205 is applied to the inner side of the bent portion along a circle A of a radius $r_A$ around an origin O, and chamfering 206 is applied to the outer side of the bent portion along a circle B of a radius $r_B$ around the origin O. The plane pattern is formed so that the radius $r_A$ of the circle A is $2D_G$ with respect to a width $D_G$ of the scanning signal line 102. The radius $r_B$ of the circle B is a sum of the radius $r_A$ of the circle A and the width $D_G$ of the scanning signal line 102. Thus, the radius $r_B$ of the circle B is $3D_G$.

Application of the plane pattern according to this embodiment improves the internal pressure of the liquid at the feature point c on a large scale so that the internal pressure of the liquid at the feature point c is 1.2 times as large as that at the feature point e, as compared with Embodiment 1 in which the former is 5.8 time as large as the latter. In the same manner, the internal pressure of the liquid at the feature point j' is improved from −4.3 times to 0.8 times.

According to Embodiment 3, a difference in internal pressure of the liquid between the feature point c, j' and the feature point e can be relaxed so that it is possible to reduce the occurrence of abnormal patterns at the time of manufacturing due to the difference in internal pressure of the liquid in the bent portion 121.

FIGS. 4A-4C are explanatory diagrams of Embodiment 4 of the present invention. FIG. 4A is a plan view showing a first plane pattern of a connection portion (hereinafter referred to as "T portion 122") between a scanning signal line 102 and a scanning signal electrode 104 formed in an inkjet method. FIG. 4B shows an example of design. FIG. 4C is a comparative table of internal pressure of liquid in feature points. The chain line shows a plane pattern 307 of a background-art T portion.

A difference in internal pressure of liquid between a feature point g and a feature point e in the scanning signal line 102 is caused by the discontinuity of a pattern in a corner of the T portion or a large curvature of the T portion in spite of the continuity of the pattern. On the other hand, a difference in internal pressure of liquid between a feature point h and a feature point e in the scanning signal line 104 is caused by a difference between a width $D_E$ of the scanning signal electrode 104 and a width $D_G$ of the scanning signal line 102.

In this embodiment, chamfering 207 is applied to each corner of the T portion along a circle A of a radius $r_A$ around an origin O. In this event, the plane pattern is formed so that the radius $r_A$ of the circle A is $2D_G$ with respect to the width $D_G$ of the scanning signal line 102. The width $D_E$ of the scanning signal electrode 104 is made equal to the width $D_G$ of the scanning signal line 102.

Application of the plane pattern according to Embodiment 4 improves the internal pressure of the liquid at the feature point g without changing the internal pressure of the liquid at the feature point f, so that the internal pressure of the liquid at the feature point g is 0.0 time as large as that at the feature point e, as compared with the plane pattern according to the background art in which the former is −4.3 time as large as the latter. In the same manner, the internal pressure of the liquid at the feature point h is improved from 2.0 times to 1.0 time.

According to Embodiment 4, a difference in internal pressure of the liquid between the feature point g, h and the feature point e can be relaxed so that it is possible to reduce the occurrence of abnormal patterns at the time of manufacturing due to the difference in internal pressure of the liquid in the T portion 122.

FIGS. 5A-5C are explanatory diagrams of Embodiment 5 of the present invention. FIG. 5A is a plan view showing a first plane pattern of a connection portion (T portion 122) between a scanning signal line 102 and a scanning signal electrode 104 formed in an inkjet method. FIG. 5B shows an example of design. FIG. 5C is a comparative table of internal pressure of liquid in feature points. The chain line shows a plane pattern 307 of a background-art T portion.

In Embodiment 5, chamfering 207 is applied to each corner of the T portion and a width $D_E$ of the scanning signal electrode 104 is made equal to a width $D_G$ of the scanning signal line 102 in the same manner as in Embodiment 3. In addition to this method, chamfering 208 along a circle C of a radius $r_c$ around an origin $O_c$ is applied to a surface of the T portion opposed to the corners, so as to provide the plane pattern with a concave portion. In addition, a side of the scanning signal line 102 where the concave portion has been formed is formed out of a gentle curved surface. Thus, discontinuity is prevented in the plane pattern. In this event, the plane pattern is formed so that the radius $r_A$ is $2D_G$ with respect to the width $D_G$ Of the scanning signal line 102. In the same manner, the plane pattern is formed so that the relations $r_C=2.0D_G$, $D_G'=0.8D_G$ and $D_E=D_G$ are established.

Application of the plane pattern according to Embodiment improves the internal pressure of the liquid at the feature point g on a large scale without changing the internal pressure of the liquid at the feature point f, so that the internal pressure of the liquid at the feature point g is 1.0 time as large as that at the feature point e, as compared with the plane pattern according to the background art in which the former is −4.3 time as large as the latter. In the same manner, the internal pressure of the liquid at the feature point h is improved from 2.0 times to 1.0 time.

According to Embodiment 5, a difference in internal pressure of the liquid between the feature point g, h and the feature point e can be relaxed so that it is possible to reduce the occurrence of abnormal patterns at the time of manufacturing due to the difference in internal pressure of the liquid in the T portion 122.

Figure 6A:
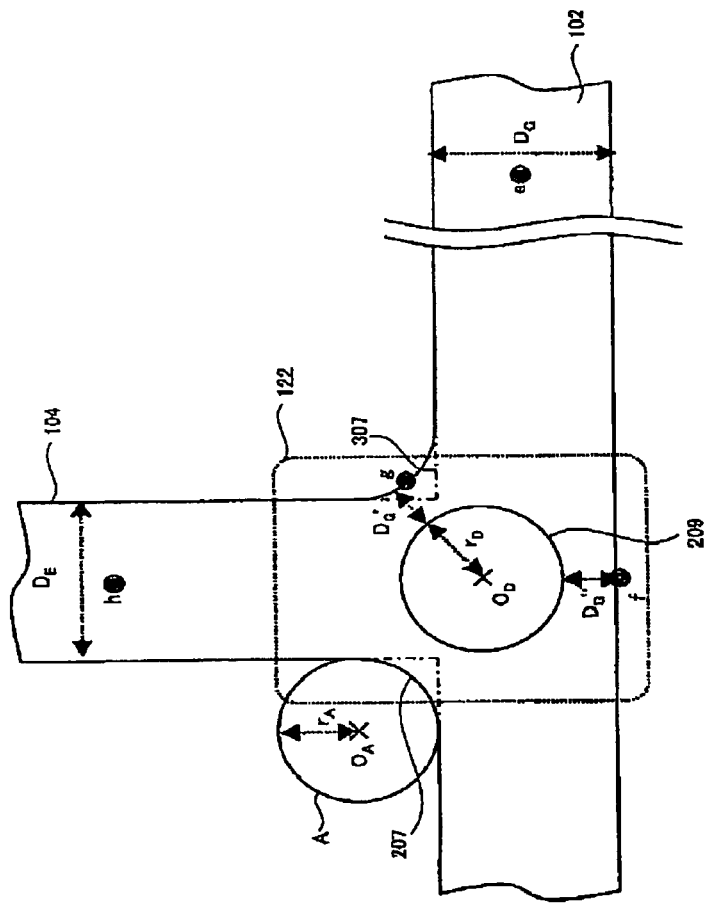

FIGS. 6A-6C are explanatory diagrams of Embodiment 6 of the present invention. FIG. 6A is a plan view showing a plane pattern of a connection portion (T portion 122) between a scanning signal line 102 and a scanning signal electrode 104 formed in an inkjet method. FIG. 6B shows an example of design. FIG. 6C is a comparative table of internal pressure of liquid in feature points. The chain line shows a plane pattern 307 of a background-art T portion.

In Embodiment 6, chamfering 207 is applied to each corner of the T portion and a width $D_E$ of the scanning signal electrode 104 is made equal to a width $D_G$ of the scanning signal line 102 in the same manner as in Embodiment 3. In addition to this method, a T portion cut pattern 209 of a radius $r_D$ is disposed inside the scanning signal line 102 near the T portion. No wiring is formed in the T portion cut pattern 209. Thus, the scanning signal line 102 is formed into a wiring pattern in which a circular hole is made in the wiring. In this event, the plane pattern is formed so that the radius $r_A$ is $0.8D_G$ with respect to the width $D_G$ of the scanning signal line 102. In the same manner, the plane pattern is formed so that the relations $r_D=0.8D_G$, $D_G'=0.6D_G$, $D_G''=D_G'$ and $D_E=D_G$ are established.

Application of the plane pattern according to Embodiment 6 improves the internal pressure of the liquid at the feature point g on a large scale without changing the internal pressure of the liquid at the feature point f, so that the internal pressure of the liquid at the feature point g is 1.0 time as large as that at the feature point e, as compared with the plane pattern according to the background art in which the former is −4.3 time as large as the latter. In the same manner, the internal pressure of the liquid at the feature point h is improved from 2.0 times to 1.0 time.

Due to the application of this embodiment, a difference in internal pressure of the liquid between the feature point g, h and the feature point e can be relaxed so that it is possible to reduce the occurrence of abnormal patterns at the time of manufacturing due to the difference in internal pressure of the liquid in the T portion 122.

Figure 7A:
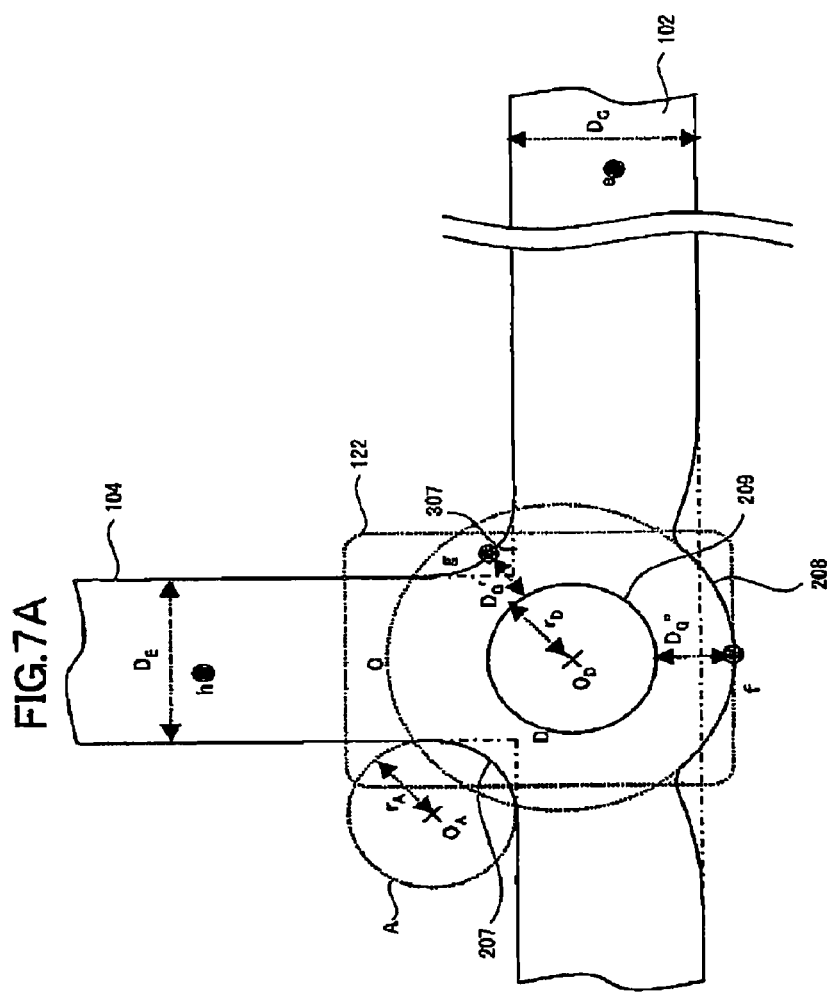

FIGS. 7A-7C are explanatory diagrams of Embodiment 7 of the present invention. FIG. 7A is a plan view showing a plane pattern of a connection portion (T portion 122) between a scanning signal line 102 and a scanning signal electrode 104 formed in an inkjet method. FIG. 7B shows an example of design. FIG. 7C is a comparative table of internal pressure of liquid in feature points. The chain line shows a plane pattern 307 of a background-art T portion.

In Embodiment 7, chamfering 207 is applied to each corner of the T portion and a width $D_E$ of the scanning signal electrode 104 is made equal to a width $D_G$ of the scanning signal line 102 in the same manner as in Embodiment 3. In addition to this method, a T portion cut pattern 209 is disposed as described in Embodiment 6. Further, chamfering 208 along a circle D of a radius $r_D$ around an origin $O_D$ is applied to a surface of the T portion opposed to the corners, so as to provide the plane pattern with a convex portion. In addition, a side of the scanning signal line 102 where the convex portion has been formed is formed out of a gentle curved surface. Thus, discontinuity is prevented in the plane pattern. In this event, the plane pattern is formed so that the radius $r_A$ is $0.8D_G$ with respect to the width $D_G$ of the scanning signal line 102.

In the same manner, the plane pattern is formed so that the relations $r_D=0.8D_G$, $D_G'=0.6D_G$, $D_G=1.12D_G$ and $D_E=D_G$ are established.

Application of the plane pattern according to Embodiment 7 improves the internal pressure of the liquid at the feature point g on a large scale without changing the internal pressure of the liquid at the feature point f, so that the internal pressure of the liquid at the feature point g is 1.1 time as large as that at the feature point e, as compared with the plane pattern according to the background art in which the former is −4.3 time as large as the latter. In the same manner, the internal pressure of the liquid at the feature point h is improved from 2.0 times to 1.0 time.

Due to the application of Embodiment 7, a difference in internal pressure of the liquid between the feature point g, h and the feature point e can be relaxed so that it is possible to reduce the occurrence of abnormal patterns at the time of manufacturing due to the difference in internal pressure of the liquid in the T portion 122.

Figure 8A:
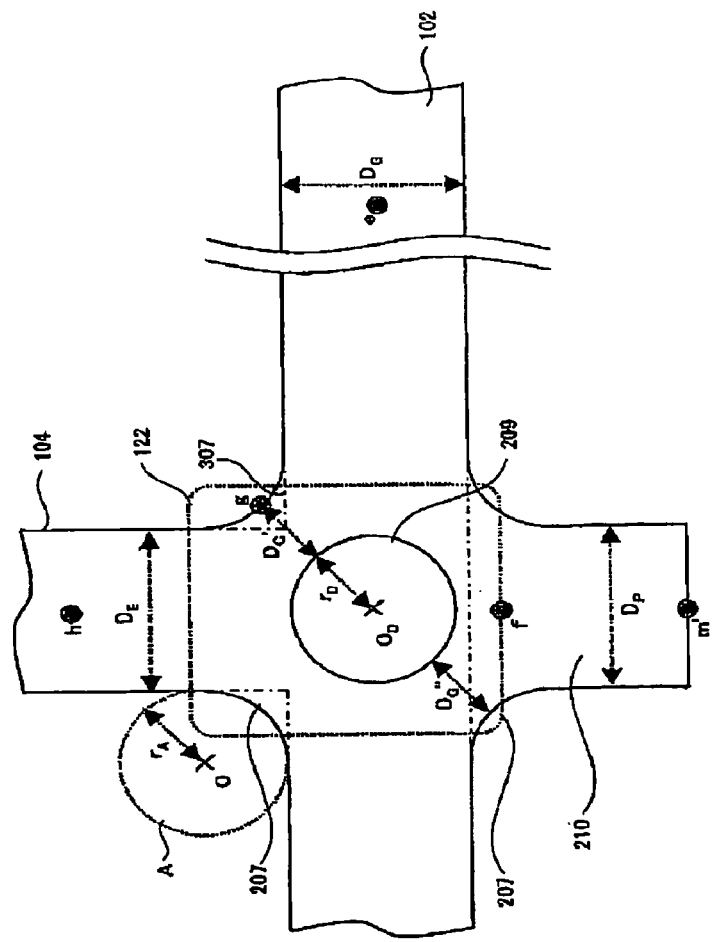

FIGS. 8A-8C are explanatory diagrams of Embodiment 8 of the present invention. FIG. 8A is a plan view showing a plane pattern of a connection portion (T portion 122) between a scanning signal line 102 and a scanning signal electrode 104 formed in an inkjet method. FIG. 8B shows an example of design. FIG. 8C is a comparative table of internal pressure of liquid in feature points. The chain line shows a plane pattern 307 of a background-art T portion.

In Embodiment 8, chamfering 207 is applied to each corner of the T portion as described in Embodiment 3. In addition, a width $D_E$ of the scanning signal electrode 104 is made equal to a width $D_G$ of the scanning signal line 102, and a T portion cut pattern 209 is disposed as described in Embodiment 6. In addition to these methods, the plane pattern is formed so that a linear pattern 210 of a width $D_P$ is added to a surface of the T portion opposed to the corners. Further, chamfering 207 is applied to each corner of the connection portion between the linear pattern 210 of the opposed surface of the T portion and the scanning signal line 102 in the same manner as the aforementioned chamfering 207 applied to each corner of the T portion. In this event, the plane pattern is formed so that the radius $r_A$ is $0.8D_G$ with respect to the width $D_G$ of the scanning signal line 102. In the same manner, the plane pattern is formed so that the relations $r_D=0.8D_G$, $D_G'=0.6D_G$, $D_G''=0.6D_G$, $D_E=D_G$ and $D_P=D_G$ are established.

Application of the plane pattern according to Embodiment 8 improves the internal pressure of the liquid at the feature point g on a large scale without changing the internal pressure of the liquid at the feature point f, so that the internal pressure of the liquid at the feature point g is 1.0 time as large as that at the feature point e, as compared with the plane pattern according to the background art in which the former is −4.3 time as large as the latter. In the same manner, the internal pressure of the liquid at the feature point h is improved from 2.0 times to 1.0 time.

According to Embodiment 8, a difference in internal pressure of the liquid between the feature point g, h and the feature point e can be relaxed so that it is possible to reduce the occurrence of abnormal patterns at the time of manufacturing due to the difference in internal pressure of the liquid in the T portion 122.

In the plane pattern according to Embodiment 8, there appears another new feature point m' in a terminal portion of the linear pattern 210 of the opposed surface of the T portion. The internal pressure of the liquid at the feature point m' is higher than that at the feature point e. As a result, the feature point m' may cause occurrence of an abnormal pattern. A plane pattern to relax the difference in internal pressure of the liquid at the feature point m' will be shown later in Embodiment 10.

FIGS. 9A-9C are explanatory diagrams of Embodiment 9 of the present invention. FIG. 9A is a plan view showing a plane pattern of a crossing portion 105 between a scanning signal line 102 and a scanning signal electrode 104 formed in an inkjet method. FIG. 9B shows an example of design. FIG. 9C is a comparative table of internal pressure of liquid in feature points. The chain line shows a plane pattern 310 of a background-art crossing portion.

A difference in internal pressure of liquid between each feature point j, k, l and a feature point e in the scanning signal line 102 is caused by the discontinuity of a pattern in each corner of a connection portion and a width $D_G'$ of the crossing portion 105 narrower than a width $D_G$ of the scanning signal line 102.

In Embodiment 9, a pattern is formed so that chamfering 211 along a circle A of a radius $r_A$ around an origin $O_A$ is applied to each corner of the crossing portion. In addition, a side of the crossing portion 105 where the chamfering has been applied is formed out of a gentle curved surface. Thus, discontinuity is prevented in the pattern. In this event, the plane pattern is formed so that the radius $r_A$ is $1.5D_G$ with respect to the width $D_G$ of the scanning signal line 102. It is assumed that a width $D_G$ of the crossing portion 105 is $0.5D_G$.

Application of the plane pattern according to Embodiment 9 improves the internal pressure of the liquid at the feature point j on a large scale, so that the internal pressure of the liquid at the feature point j is 1.0 time as large as that at the feature point e, as compared with the plane pattern according to the background art in which the former is 5.8 times as large as the latter. In the same manner, the internal pressure of the liquid at the feature point k is improved from −3.7 times to 1.7 times, and the internal pressure of the liquid at the feature point l is improved from 2.0 times to 1.7 times.

According to the application of Embodiment 9, a difference in internal pressure of the liquid between the feature point j, k, l and the feature point e can be relaxed so that it is possible to reduce the occurrence of abnormal patterns at the time of manufacturing due to the difference in internal pressure of the liquid.

Figure 10A:
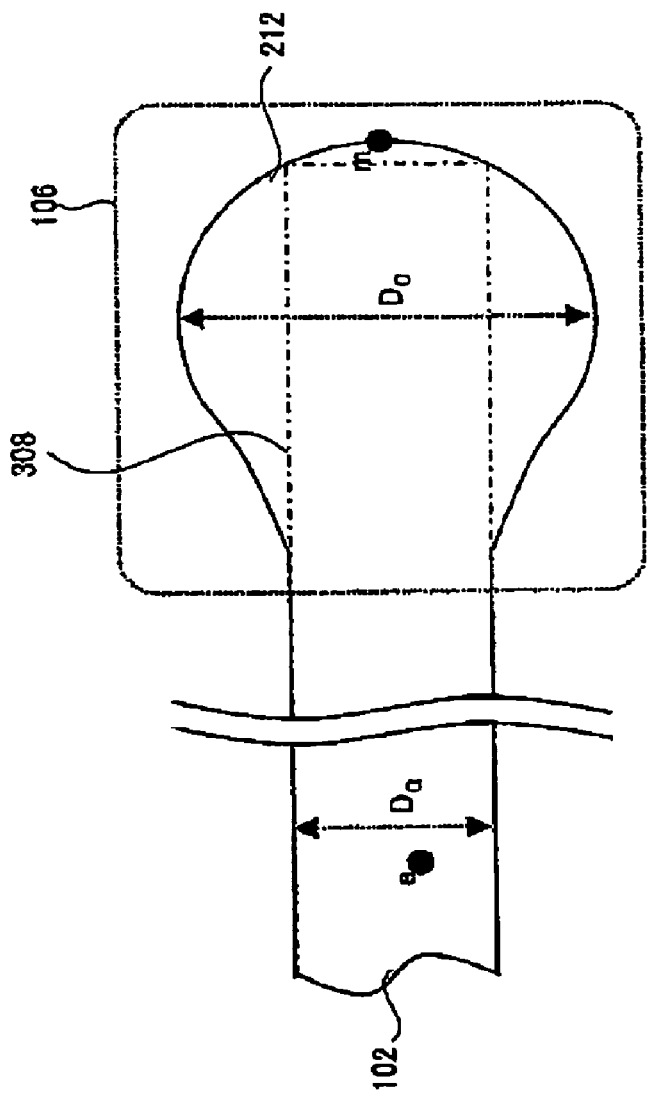

FIGS. 10A-10C are explanatory diagrams of Embodiment 10 of the present invention. FIG. 10A is a plan view showing a plane pattern of a terminal portion 106 of a scanning signal line 102 formed in an inkjet method. FIG. 10B shows an example of design. FIG. 10C is a comparative table of internal pressure of liquid in feature points. The chain line shows a plane pattern 308 of a background-art terminal portion.

In FIG. 10A, a difference in internal pressure of liquid between a feature point m and a feature point e in the scanning signal line 102 occurs due to the fact that the terminal portion 106 has a biaxial curvature while the feature point e has a uniaxial curvature.

In Embodiment 10, a semicircular pattern 212 having a chord length $D_C$ is connected to the terminal portion. The plane pattern is formed so that the scanning signal line 102 and the terminal portion semicircular pattern 212 are connected through a gentle curved surface. Thus, discontinuity is prevented in the plane pattern. In this event, the plane pattern is formed so that the chord length $D_C$ is $2D_G$ with respect to a width $D_G$ of the scanning signal line 102

Due to the plane pattern according to Embodiment 10, application of this embodiment improves the internal pressure of the liquid at a feature point m so that the internal pressure of the liquid at the feature point m is 1.0 time as large as that at the feature point e, as compared with the plane pattern according to the background art in which the former is 2.0 times as large as the latter.

According to the application of the plane pattern of Embodiment 10, a difference in internal pressure of the liquid between the feature point m and the feature point e can be relaxed so that it is possible to reduce the occurrence of abnormal patterns at the time of manufacturing due to the difference in internal pressure of the liquid.

Figure 11:
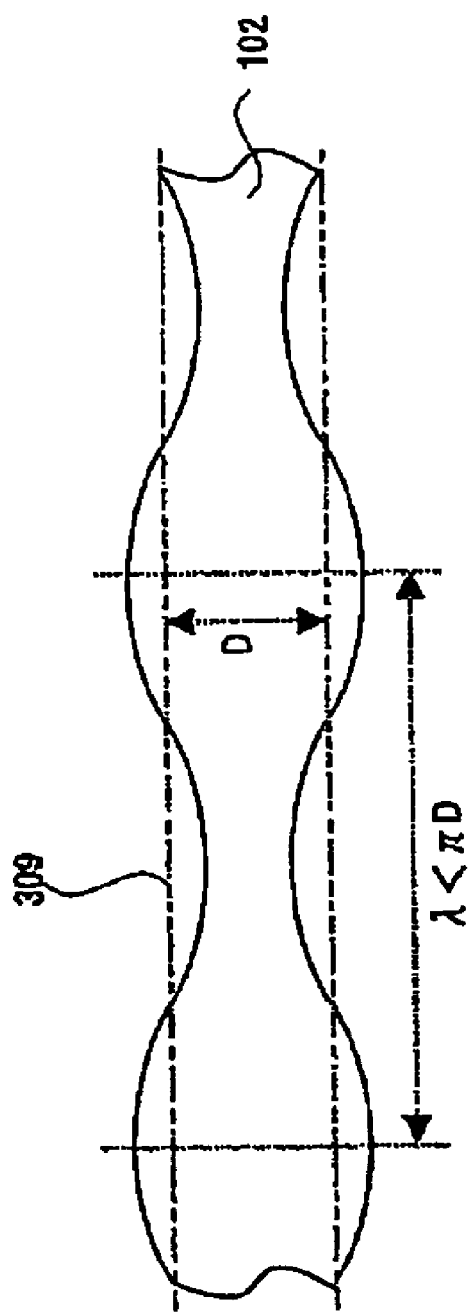
FIG. 11 is a diagram for explaining Embodiment 11 of the present invention.

FIG. 11 is an explanatory diagram of Embodiment 11 of the present invention, showing a first plane pattern of a scanning signal line 102 formed in an inkjet method. The chain line shows a plane pattern 309 of a background-art scanning signal line.

In Embodiment 11, a plane pattern is beforehand formed into a waved shape which is symmetric with respect to an axis parallel to the extending direction of the scanning signal line 102. In this event, the plane pattern is formed so that a period $\lambda$ of waves of the waved shape satisfies $\lambda < \pi D$ with respect to an average line width D of the scanning signal line 102.

Due to application of the plane pattern according to Embodiment 11, the surface energy can be lowered in comparison with that in the plane pattern 309 of the background-art scanning signal line. Thus, it is possible to suppress the fluidity of the pattern caused by the surface energy.

According to the application of Embodiment 11, it is possible to suppress the occurrence of abnormal patterns at the time of manufacturing due to the surface energy.

Figure 12:
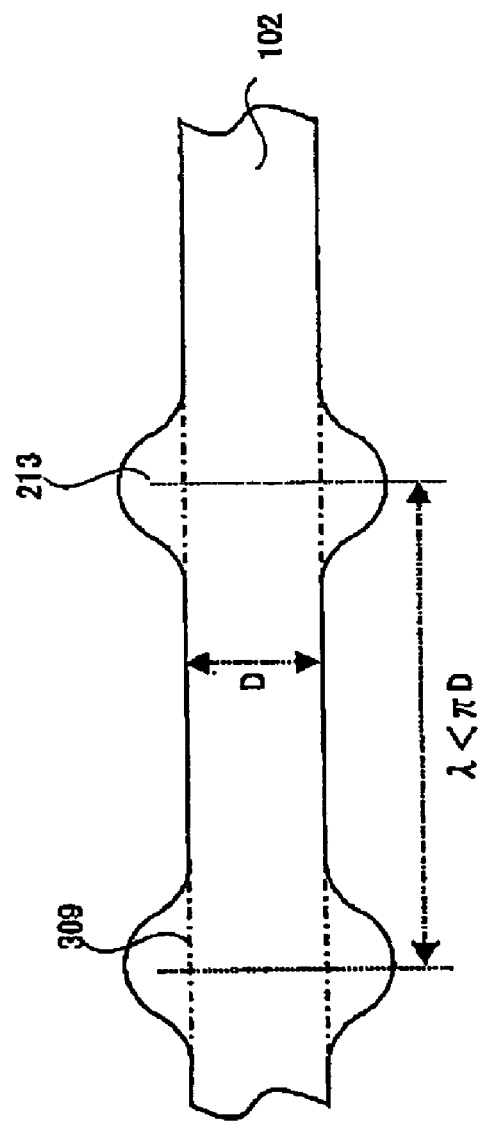
FIG. 12 is a diagram for explaining Embodiment 12 of the present invention.

FIG. 12 is an explanatory diagram of Embodiment 12 of the present invention, showing a second plane pattern of a scanning signal line 102 formed in an inkjet method. In Embodiment 12, a plane pattern is formed so that protrusion portions 213 are provided in parts of the scanning signal line 102. The protrusion portions 213 are disposed to be symmetric with respect to an axis parallel to the extending direction of the scanning signal line 102. In this event, the plane pattern is formed so that a period $\lambda$ of the protrusion portions satisfies $\lambda < \pi D$ with respect to an average line width D of the scanning signal line 102.

Due to application of the plane pattern according to Embodiment 12, the surface energy can be lowered in comparison with that in the plane pattern 309 of the background-art scanning signal line. Thus, it is possible to suppress the fluidity of the pattern caused by the surface energy.

According to the application of Embodiment 12, it is possible to suppress the occurrence of abnormal patterns at the time of manufacturing due to the surface energy.

Figure 13:
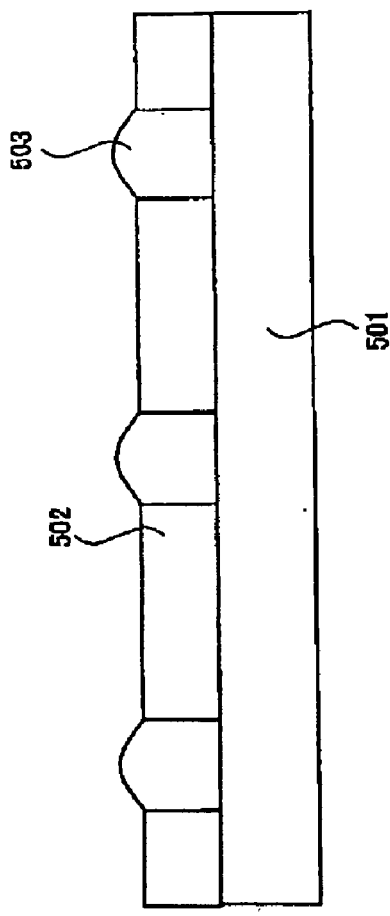
FIG. 13 is a diagram for explaining Embodiment 13 of the present invention.

FIG. 13 is an explanatory diagram of Embodiment 13 of the present invention, showing a sectional shape of a pattern formed in an inkjet method. Embodiment 13 has a structure in which a step 502 is formed on an insulating substrate 501 in each portion where a pattern 503 is absent. The step 502 is formed by patterning after applying an organic film or the like in a spin coat method, or by a printing method or the like. After the step 502 is formed, the pattern 503 is formed by a liquid process such as an inkjet method or the like.

According to application of the sectional structure of Embodiment 13, there is another effect that liquid can be dammed by the wall of the step, in addition to the effects shown in Embodiments 1-12. Thus, it is possible to reduce the occurrence of abnormal patterns at the time of manufacturing.

In addition, in Embodiment 13, the contact angle with the liquid on the step 502 is made higher than the contact angle with the liquid on the insulating substrate 501, so that the effect of damming the liquid can be increased. Thus, it is possible to suppress the occurrence of abnormal patterns more effectively.

Figure 14:
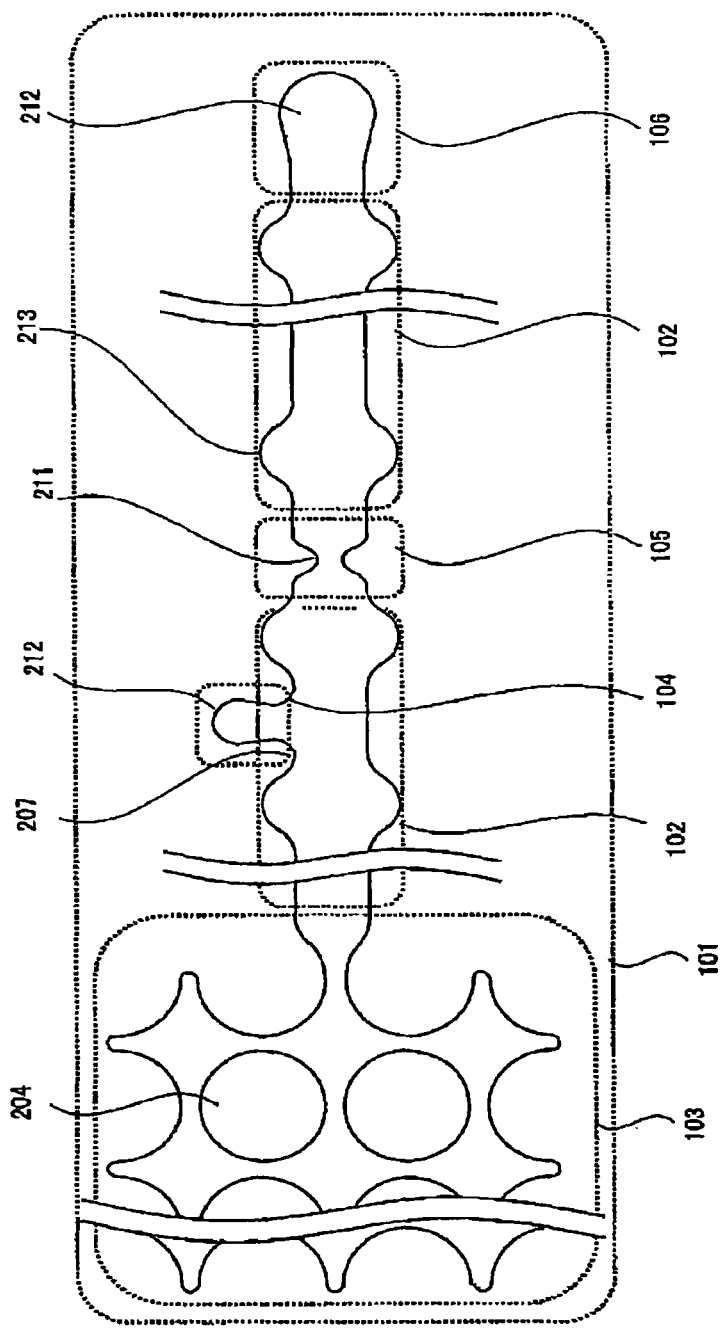
FIG. 14 is a diagram for explaining Embodiment 14 of the present invention.

FIG. 14 is an explanatory diagram of Embodiment 14 of the present invention, showing a plane pattern of a scanning line 101 formed in an inkjet method or the like. In Embodiment 14, circular cut patterns 204 are disposed in a terminal portion 103. Protrusion portions 213 are provided in a scanning signal line 102 so as to be symmetric with respect to an axis parallel to the extending direction of the scanning signal line 102. Chamfering 207 is applied to each corner of a connection portion between a scanning signal electrode 104 and the scanning signal line 102, and a terminal portion semicircular pattern 212 is disposed in a terminal portion of the scanning signal electrode 104. Chamfering 211 is applied to each corner of a crossing portion 105, and a terminal portion semicircular pattern 212 is disposed in a terminal portion 106. These patterns are connected through gentle curved surfaces respectively. Thus, the patterns are prevented from being discontinuous.

According to application of Embodiment 14, a difference in internal pressure of liquid between any two points of the scanning line 101 can be relaxed, and the surface energy can be lowered. Thus, it is possible to suppress occurrence of abnormal patterns at the time of manufacturing.

Figure 15:
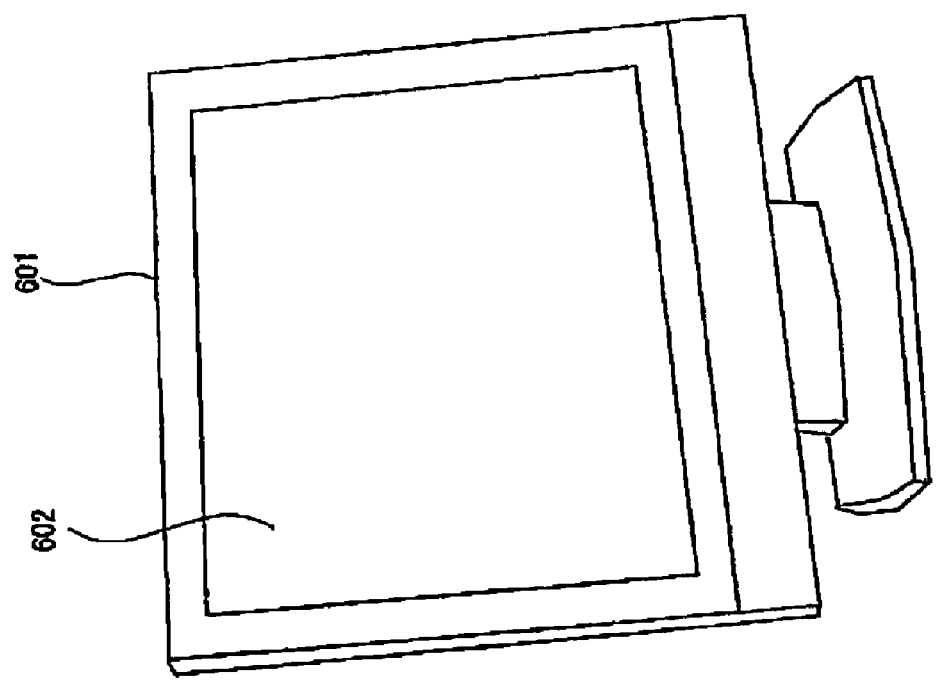
FIG. 15 is an outline view of a liquid crystal display device using wiring formed in an inkjet method.
Figure 16:
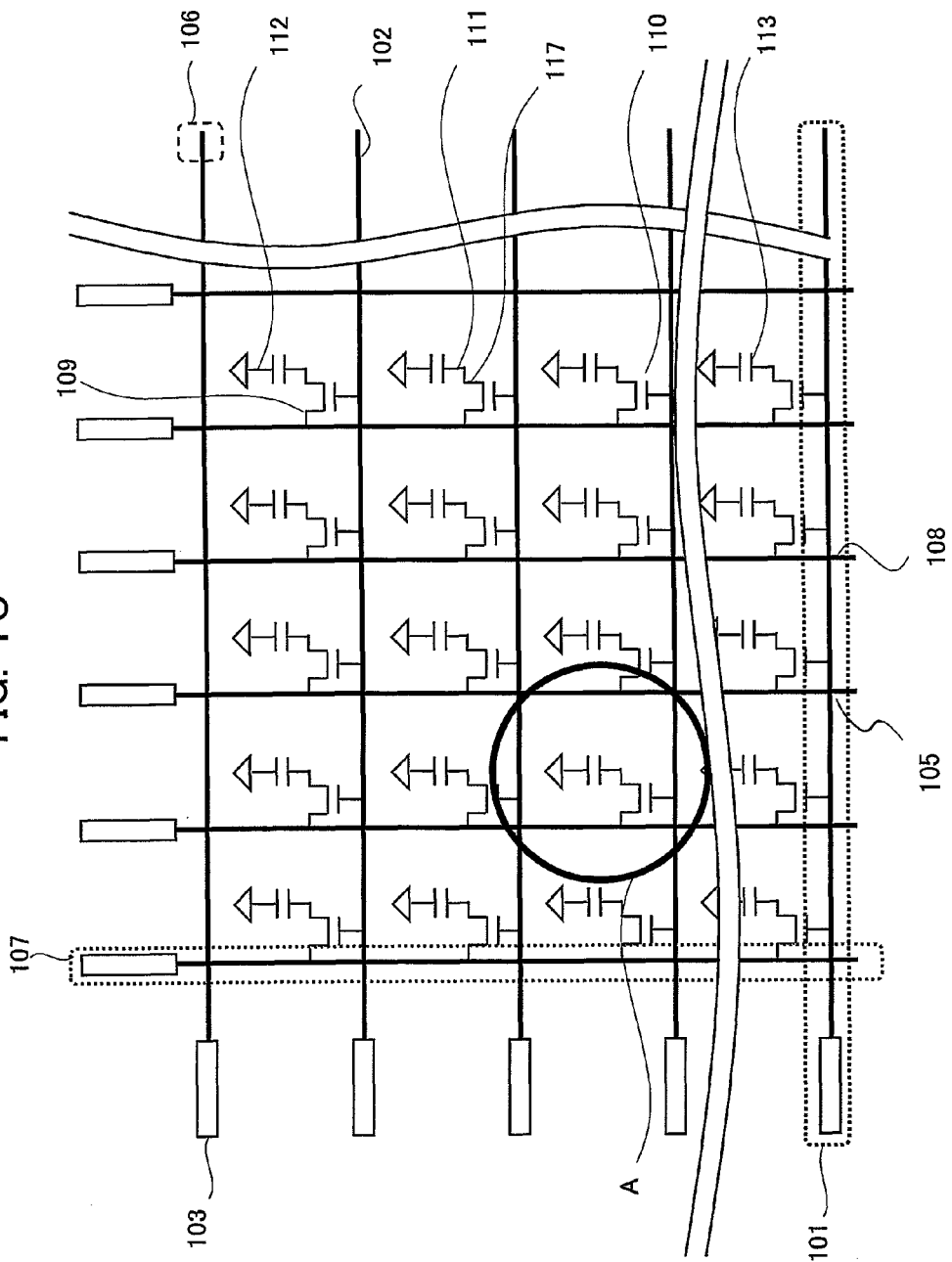
FIG. 16 is a schematic circuit diagram of a display portion of the liquid crystal display device shown in FIG. 15.
Figure 17:
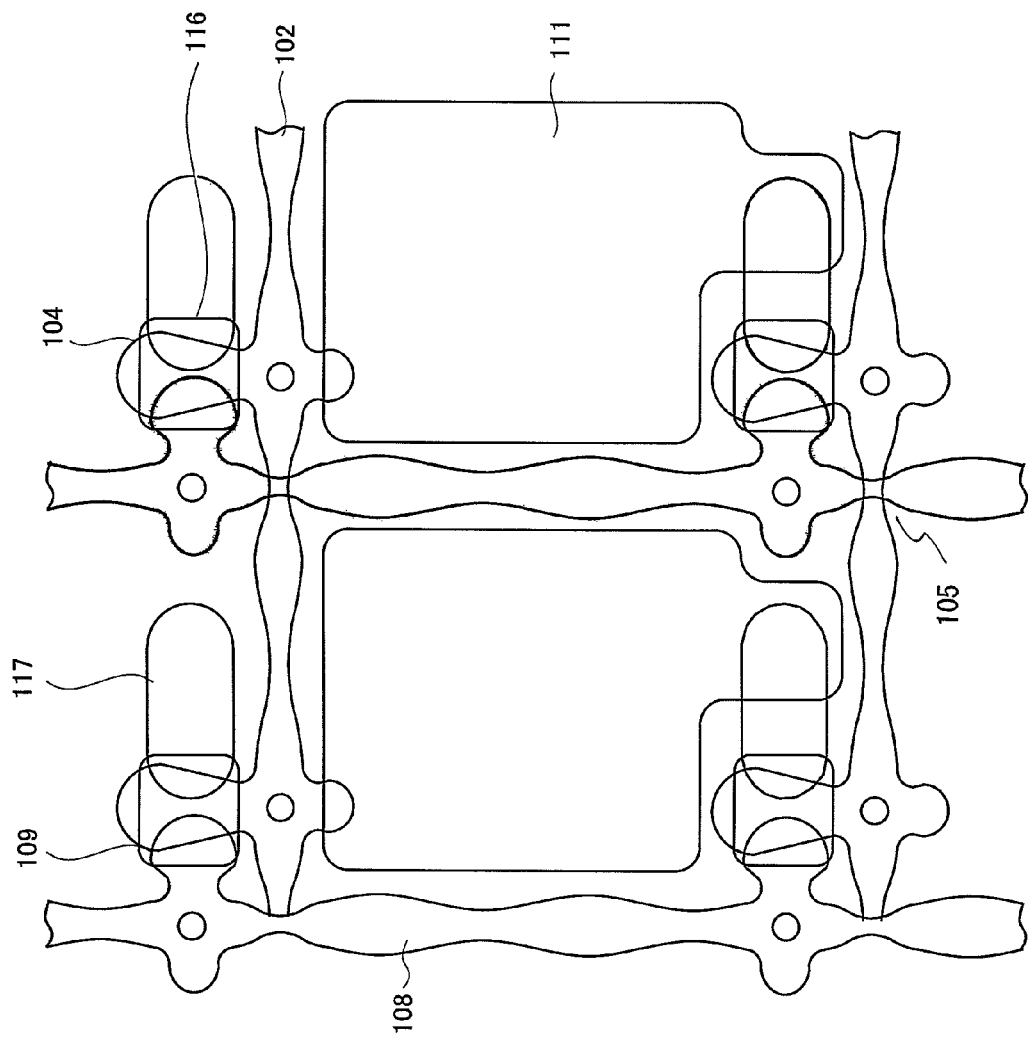
FIG. 17 is a plan view of the TFT substrate side of a region A shown in FIG. 16.

FIGS. 15-17 are explanatory diagrams of Embodiment 15 of the present invention. FIG. 15 is an outline view of a liquid crystal display device 601 using wiring formed in an inkjet method. Scanning lines, video lines, semiconductor layers, and pixel electrodes to which the aforementioned plane patterns shown in Embodiments 1-14 have been applied are used in a display portion 602 of the liquid crystal display device 601.

FIG. 16 is a schematic circuit diagram of the display portion 602 of the liquid crystal display device 601 shown in FIG. 15. In the liquid crystal display device 601 shown in FIG. 15, a plurality of scanning lines 101 are formed horizontally at even intervals. A plurality of video lines 107 are formed at even intervals vertically to the scanning lines 101. Each of the scanning lines 101 and the video lines 107 is provided in at least one end thereof with a terminal portion 103 for connecting with an external drive circuit. Near a crossing portion 105 between each scanning line 101 and each video line 107, a thin film transistor (TFT) 110 is disposed as a switching device, which is connected to the scanning signal line 101 through a scanning signal electrode 104 and to the video line 107 through a video signal electrode 109. One end of the thin film transistor 110 is connected to a pixel electrode 111 through a source electrode 117. A liquid crystal 113 is sandwiched between the pixel electrode 111 and a common electrode 112. The liquid crystal 113 is driven by a voltage applied between the pixel electrode 111 and the common electrode 112.

FIG. 17 is a plan view of the TFT substrate side of a region A shown in FIG. 16. In FIG. 17, the plane patterns shown in Embodiments 1-14 are applied to the scanning signal lines 102, the scanning signal electrodes 104, the crossing portions 105, the video signal lines 108, the video signal electrodes 109, the semiconductor layers 116, and the pixel electrodes 111.

According to Embodiment 15, it is possible to construct the liquid crystal display device 601 in which occurrence of abnormal patterns is suppressed in the scanning lines 101, the video lines 107, the semiconductor layers 116 and the pixel electrodes 111.

In addition to the aforementioned embodiments, the following configurations can be applied. First, in the aforementioned Embodiment 1, a plane pattern is formed so that cut patterns are disposed in parallel to a scanning signal line.

However, similar effects can be obtained if the cut patterns are disposed perpendicularly to the scanning signal line.

Figure 18:
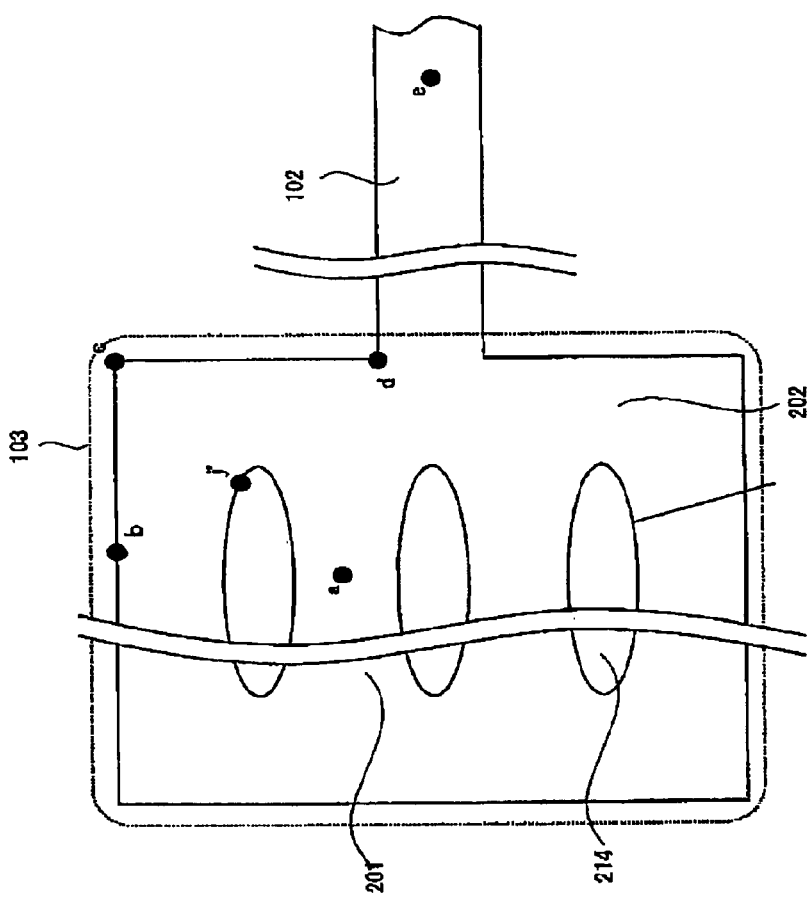
FIG. 18 is a diagram for explaining another plane pattern of a terminal portion of a scanning line formed in an inkjet method.
Figure 19:
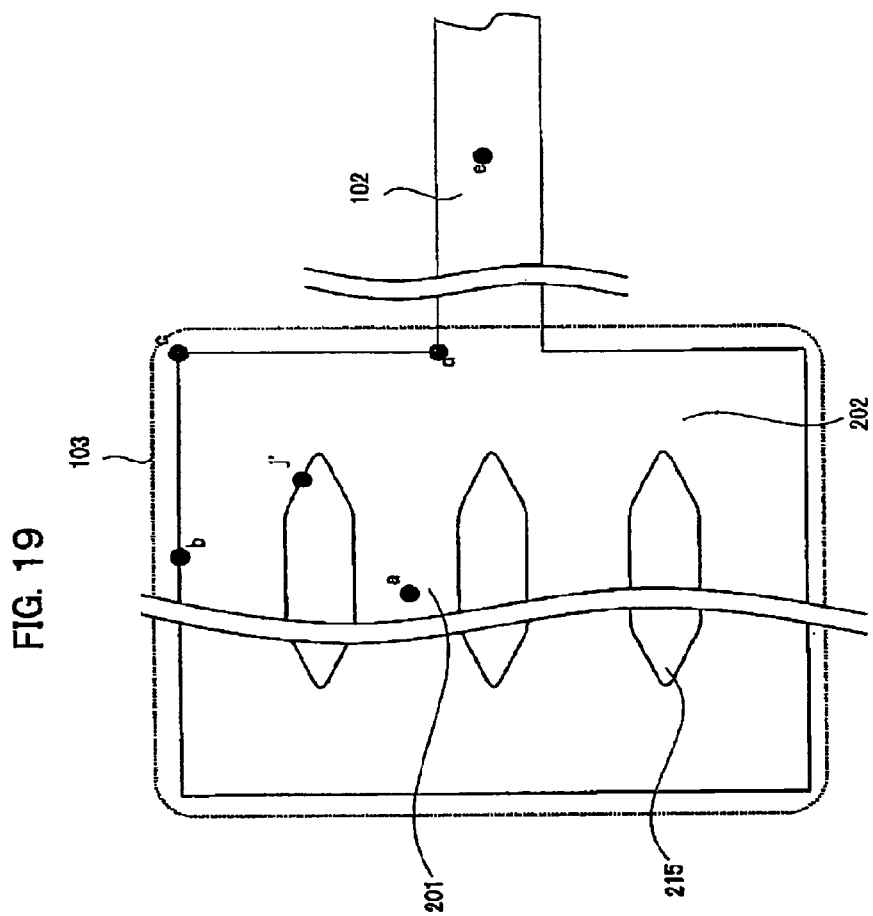
FIG. 19 is a diagram for explaining another plane pattern of a terminal portion of a scanning line formed in an inkjet method.

In Embodiment 1, the cut patterns are formed as rod-like cut patterns. However, the cut patterns may be formed as substantially elliptic cut patterns 214 as shown in FIG. 18 or as substantially hexagonal cut patterns 215 as shown in FIG. 19. Similar effects can be obtained in this case.

Figure 20:
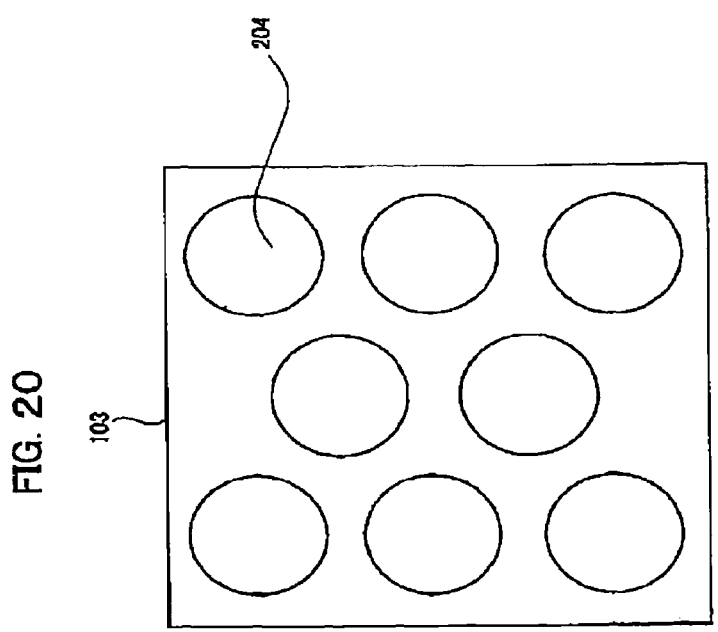
FIG. 20 is a diagram for explaining another plane pattern of a terminal portion of a scanning line formed in an inkjet method.
Figure 24:
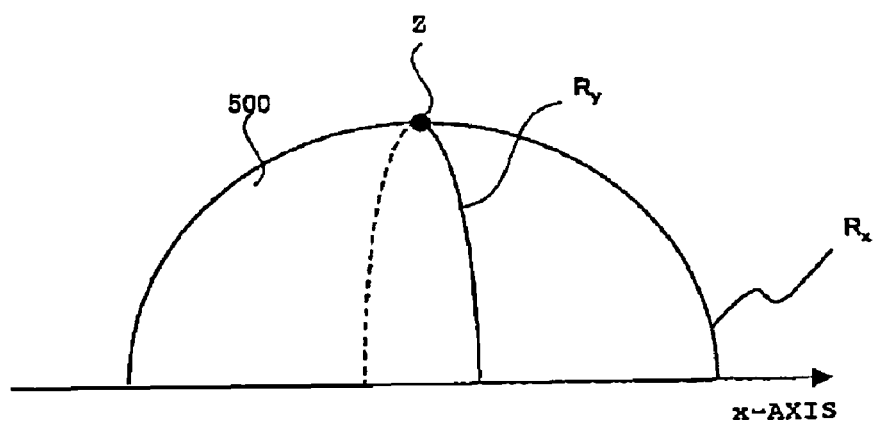
FIG. 24 is a diagram for explaining the internal pressure of liquid.
Figure 25A:
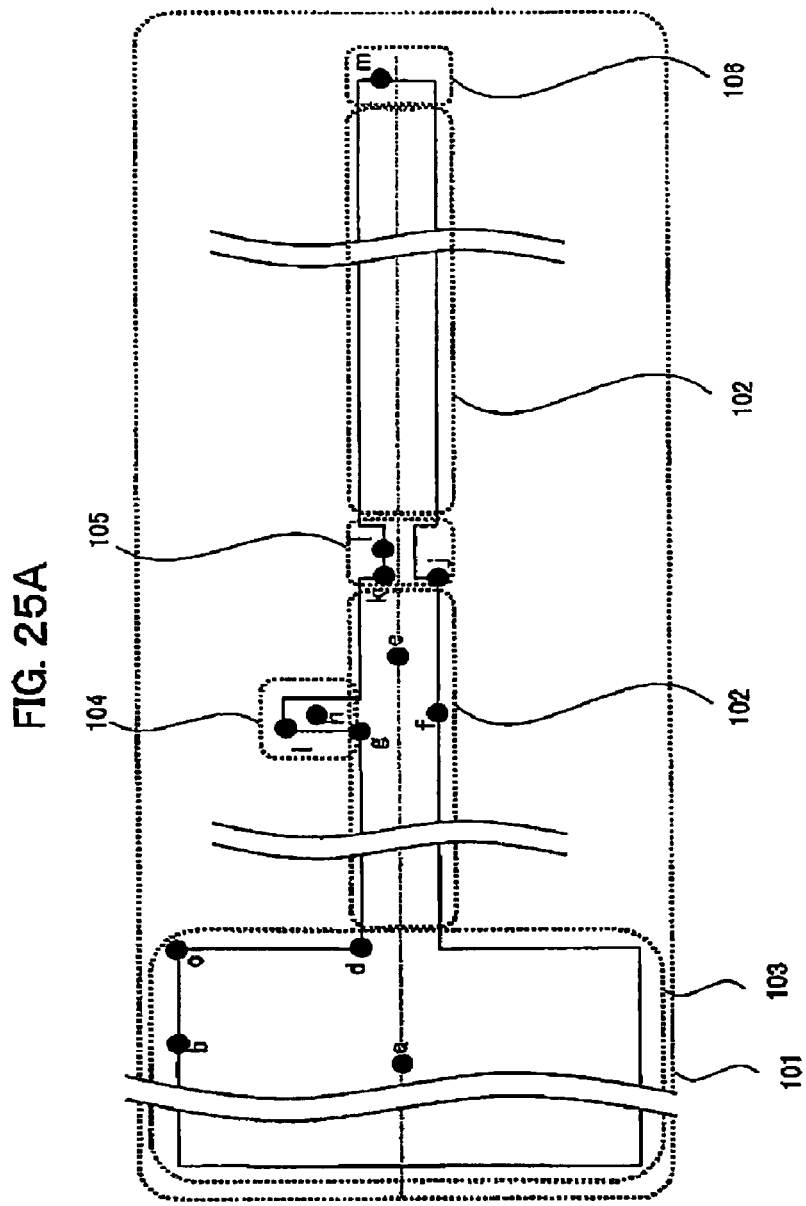

In Embodiment 2, a plane pattern is formed so that terminal portion circular cut patterns 204 are disposed on a square grille. However, the cut patterns 204 may be disposed on a hexagonal grille as shown in FIG. 20. Similar effects can be obtained in this case.

In Embodiment 2, 6, 7 or 8, a cut pattern is formed to be substantially circular. However, the cut pattern may be formed as a substantially octagonal T portion cut pattern 209 as shown in FIG. 21. Similar effects can be obtained in this case. In the same manner, occurrence of abnormal patterns can be suppressed if a substantially elliptic cut pattern or a substantially n-sided (n is an integer larger than 3) cut pattern is disposed.

In Embodiment 3-8, chamfering 207 along a circle A around an origin $O_A$ is applied to each corner of a T portion. However, chamfering may be applied along an octagon AA as shown in FIG. 21. Similar effects can be obtained in this case. In the same manner, occurrence of abnormal patterns can be suppressed if substantially elliptic or substantially n-sided (n is an integer larger than 4) chamfering is disposed.

In Embodiment 3, chamfering 205 along a circle A around an origin O is applied to the inner side of a bent portion while chamfering 206 along a circle B around the origin O is applied to the outer side of the bent portion. However, chamfering may be applied to the bent portion with predetermined curvatures while the center of the circle A does not coincide with the center of the circle B. Similar effects can be obtained in this case.

In Embodiment 3, chamfering 205 along a circle A around an origin O is applied to the inner side of a bent portion while chamfering 206 along a circle B around the origin O is applied to the outer side of the bent portion. However, without being limited to this configuration, chamfering may be applied along substantially ellipses or substantially n-sided polygons (n is an integer larger than 4) around the origin O. Similar effects can be obtained in this case.

In Embodiments 5 and 7, chamfering 207 along a circle A around an origin $O_A$ is applied to each corner of a T portion. However, without being limited to this configuration, chamfering may be applied along a substantially ellipse or a substantially n-sided polygon (n is an integer larger than 4) around the origin $O_A$. Similar effects can be obtained in this case.

In Embodiment 10, a plane pattern is formed so that a terminal portion semicircular pattern 212 is disposed in a terminal portion 106. However, a shape of half an ellipse or a substantially n-sided polygon (n is an integer larger than 3) may be applied. Similar effects can be obtained in this case.

In Embodiments 1-10, effects of the present invention have been described with specific numerical values. These values are calculated on the assumption that the contact angle of the substrate with respect to the liquid is 90°. The design values will change if the contact angle of the substrate with respect to the liquid changes.

FIGS. 22A, 22B and 22C are views for explanatory diagrams of design values of plane patterns and internal pressure values in the plane patterns on the assumption that the contact angle of the substrate with respect to the liquid is 50° in Embodiments 1 to 10. FIGS. 23A, 23B and 23C are views for explanatory diagrams of design values of plane patterns and internal pressure values in the plane patterns on the assumption that the contact angle of the substrate with respect to the liquid is 20° in Embodiments 1 to 10. As is understood from FIGS. 22A, 22B, 22C, 23A, 23B and 23C, a difference in internal pressure of the liquid can be relaxed by optimum design even when the contact angle of the substrate with respect to the liquid changes. Thus, occurrence of abnormal patterns can be suppressed.

In Embodiments 1 and 2, description has been made about the shape of the terminal portion 103. Without being limited to the terminal portion 103, Embodiments 1 and 2 may be applied to any plane pattern in which a substantially linear pattern and a substantially quadrangular pattern wider than the substantially linear pattern are formed on an insulating substrate, and a short side of the substantially linear pattern is connected to a part of a side of the substantially quadrangular pattern.

In Embodiment 3, description has been made about the shape of a part of the terminal portion 103 as a site where the bent portion 121 is formed. Without being limited to a part of the terminal portion 103, Embodiment 3 may be applied to any plane pattern in which a substantially linear pattern 1 and a substantially linear pattern 2 are formed on an insulating substrate, and a short side of the substantially linear pattern 1 is connected to an end portion of along side of the substantially linear pattern 2 so as to form an L-shaped bent portion.

Further, in Embodiments 4, 5, 6, 7 and 8, description has been made about a connection portion between the scanning signal line 102 and the scanning signal electrode 104. Without being limited to the connection portion between the scanning signal line 102 and the scanning signal electrode 104, Embodiments 4, 5, 6, 7 and 8 may be applied to any plane pattern in which a substantially linear pattern 1 and a substantially linear pattern 2 are formed on an insulating substrate, and a short side of the substantially linear pattern 1 is connected to a part of a long side of the substantially linear pattern 2 so as to form a T shape.

Furthermore, in Embodiment 9, description has been made about the shape of the crossing portion 105. Without being limited to the crossing portion 105, Embodiment 9 may be applied to any plane pattern in which a substantially linear pattern 1, a substantially linear pattern 2 having a short side length equal to that of the substantially linear pattern 1 and a substantially linear pattern 3 having a short side length shorter than that of any one of the substantially linear patterns 1 and 2 are formed on an insulating substrate, while a part of a short side of the substantially linear pattern 1 is connected to a short side 1 of the substantially linear pattern 3, and the other short side 2 of the substantially linear pattern 3 is connected to a part of a short side of the substantially linear pattern 2.

In Embodiment 10, description has been made about the terminal portion 106 of the scanning signal line 102. Without being limited to the terminal portion 106 of the scanning signal line 102, the plane pattern according to Embodiment 10 may be applied to any longitudinal terminal portion of a substantially linear pattern 1.

Furthermore, in Embodiments 11 and 12, description has been made about the shape of the scanning signal line 102. However, without being limited to the scanning signal line 102, the plane patterns according to Embodiments 11 and 12 may be applied to any substantially linear pattern.

In Embodiment 13, description has been made about the case where a plane pattern according to Embodiments 2, 4, 10 and 12 is applied to the scanning signal line 102. Similar effects can be obtained when at least one of the plane patterns according to Embodiments 1 to 12 is applied.

Further, in Embodiment 16, description has been made about the case in which patterns according to Embodiments 1 to 15 are applied to a liquid crystal display device. Without being limited to the liquid crystal display device, the plane patterns may be applied to any case in which patterns of a display device such as an organic LED display device or a PDP display device or patterns of a printed circuit board or the like are formed by use of a liquid process.

What is claimed is:

1. A substrate with wiring patterns formed in a liquid process, wherein:
   said wiring patterns are formed based on a combination of plane shapes by which a difference in internal pressure of a solution between any two points of said solution is zero, said solution being ejected onto said substrate so as to form said wiring patterns by said liquid process;
   said wiring patterns are formed based on plane shapes by which a surface area of said solution is minimized, said solution being ejected onto said substrate so as to form said wiring patterns by said liquid process;
   said wiring patterns includes a wiring pattern in which a short side of a substantially linear pattern formed on said substrate is connected to a part of a side of a substantially quadrangular pattern wider than said substantially linear pattern; and
   a plurality of cut patterns are disposed in said substantially quadrangular pattern, wherein said substantially linear pattern has an average width D, and said substantially linear pattern is a waved pattern which is symmetric with respect to an axis parallel to a long side of said substantially linear pattern, and wherein a period of waves of said waved pattern is not longer than $\pi D$.

2. A substrate with wiring patterns formed in a liquid process, wherein:
   said wiring patterns are formed based on a combination of plane shapes by which a difference in internal pressure of a solution between any two points of said solution is zero, said solution being ejected onto said substrate so as to form said wiring patterns by said liquid process;
   said wiring patterns are formed based on plane shapes by which a surface area of said solution is minimized, said solution being ejected onto said substrate so as to form said wiring patterns by said liquid process;
   said wiring patterns includes a plane pattern in which a first substantially linear pattern and a second substantially linear pattern are formed on said substrate, including an L-shaped bent portion in which a short side of said first substantially linear pattern is connected to an end portion of a long side of said second substantially linear pattern; and
   chamfering is applied to a corner of said bent portion so as to reduce a curvature of said bent portion, wherein at least one of said first substantially linear pattern or said second substantially linear pattern has an average width D, and at least one of said first substantially linear pattern or said second substantially linear pattern is a waved pattern which is symmetric with respect to an axis parallel to a long side of said first substantially linear pattern or said second substantially linear pattern, respectively, and wherein a period of waves of said waved pattern is not longer than $\pi D$.

3. A substrate with wiring patterns formed in a liquid process, wherein:
   said wiring patterns are formed based on a combination of plane shapes by which a difference in internal pressure of a solution between any two points of said solution is zero, said solution being ejected onto said substrate so as to form said wiring patterns by said liquid process;
   said wiring patterns are formed based on plane shapes by which a surface area of said solution is minimized, said solution being ejected onto said substrate so as to form said wiring patterns by said liquid process;
   said wiring patterns includes a wiring pattern in which a first substantially linear pattern and a second substantially linear pattern are formed on said substrate, including a T-shaped connection portion in which a short side of said first substantially linear pattern is connected to a part of a long side of said second substantially linear pattern; and
   chamfering is applied to each corner of said connection portion so as to reduce a curvature of said connection portion, wherein at least one of said first substantially linear pattern or said second substantially linear pattern has an average width D, and at least one of said first substantially linear pattern or said second substantially linear pattern is a waved pattern which is symmetric with respect to an axis parallel to a long side of said first substantially linear pattern or said second substantially linear pattern, respectively, and wherein a period of waves of said waved pattern is not longer than $\pi D$.

4. The substrate with wiring patterns according to claim 3, wherein:
   a concave portion is provided in a part of a long side of said second substantially linear pattern opposed to said connection portion, and when said long side is expressed by a function, it is differentiable all over a domain of said function.

5. The substrate with wiring patterns according to claim 3, wherein:
   a substantially circular cut pattern is disposed inside said second substantially linear pattern near said connection portion.

6. The substrate with wiring patterns according to claim 3, wherein:
   a convex portion is provided in a part of a long side of said second substantially linear pattern opposed to said connection portion, and when said long side is expressed by a function, it is differentiable all over a domain of said function.

7. The substrate with wiring patterns according to claim 3, wherein:
   a third substantially linear pattern having a short side length substantially equal to that of said first substantially linear pattern is connected to a part of the other long side of said second substantially linear pattern opposed to said connection portion; and
   chamfering is applied to each corner of a connection portion between said second substantially linear pattern and said third substantially linear pattern so as to reduce a curvature of said connection portion.

8. A substrate with wiring patterns formed in a liquid process, wherein:
   said wiring patterns are formed based on a combination of plane shapes by which a difference in internal pressure of a solution between any two points of said solution is zero, said solution being ejected onto said substrate so as to form said wiring patterns by said liquid process;
   said wiring patterns are formed based on plane shapes by which a surface area of said solution is minimized, said solution being ejected onto said substrate so as to form said patterns by said liquid process;
   a first substantially linear pattern, a second substantially linear pattern having a short side length substantially equal to that of said first substantially linear pattern, and a third substantially linear pattern having a short side length shorter than that of any one of said first substantially linear pattern and said second substantially linear pattern are formed on said substrate;

a part of a short side of said first substantially linear pattern is connected to a short side of said third substantially linear pattern, and the other short side of said third substantially linear pattern is connected to a part of a short side of said second substantially linear pattern; and chamfering is applied to a corner of each convex portion and a corner of each concave portion of a connection portion between said first substantially linear pattern and said third substantially linear pattern and to a corner of each convex portion and a corner of each concave portion of a connection portion between said second substantially linear pattern and said third substantially linear pattern so as to reduce curvatures of said connection portions, wherein at least one of said first substantially linear pattern or said second substantially linear pattern has an average width D, and at least one of said first substantially linear pattern or said second substantially linear pattern is a waved pattern which is symmetric with respect to an axis parallel to a long side of said first substantially linear pattern or said second substantially linear pattern, respectively, and wherein a period of waves of said waved pattern is not longer than $\pi D$.

9. A substrate with wiring patterns formed in a liquid process, wherein:

said wiring patterns are formed based on a combination of plane shapes by which a difference in internal pressure of a solution between any two points of said solution is zero, said solution being ejected onto said substrate so as to form said wiring patterns by said liquid process;

said wiring patterns are formed based on plane shapes by which a surface area of said solution is minimized, said solution being ejected onto said substrate so as to form said wiring patterns by said liquid process;

said wiring patterns includes a wiring pattern in which a substantially linear pattern is formed on an insulating substrate by use of said liquid; and a substantially semicircular pattern having a chord longer than a short side of said substantially linear pattern is connected to a longitudinal terminal portion of said substantially linear pattern, and chamfering is applied to each corner of a connection portion between said substantially linear pattern and said substantially semicircular pattern so as to reduce a curvature of said connection portion, wherein said substantially linear pattern has an average width D, and said substantially linear pattern is a waved pattern which is symmetric with respect to an axis parallel to a long side of said substantially linear pattern, and wherein a period of waves of said waved pattern is not longer than $\pi D$.

10. The substrate with wiring patterns according to claim 9, wherein said chord of said substantially semicircular pattern is 1.5 to 5.0 times as long as said short side of said substantially linear pattern.

11. A display device comprising a pair of substrates, a liquid crystal layer put between said pair of substrates, a common signal electrode formed on one of said pair of substrates and having transparency, a plurality of scanning lines formed on the other substrate, a plurality of video lines substantially perpendicular to said scanning lines, thin film transistors formed near crossing points between said scanning lines and said video lines, and pixel electrodes connected to said thin film transistors; wherein:

said other substrate is a substrate having wiring patterns according to any one of claims 2, 3, 8, and 9; and said wiring patterns serve as at least a part of said scanning lines, said video lines, source electrodes, semiconductor layers, and said pixel electrodes.

12. The substrate with wiring patterns according to claim 1, wherein said cut patterns are substantially linear cut patterns and are disposed in said substantially quadrangular pattern substantially in parallel with one another and is combtooth shaped.

13. The substrate with wiring patterns according to claim 1, wherein said cut patterns are substantially circular cut patterns and are disposed in said substantially quadrangular pattern at even intervals in row and column directions.

* * * * *